United States Patent
Hofmann et al.

(10) Patent No.: US 6,229,169 B1
(45) Date of Patent: May 8, 2001

(54) MEMORY CELL CONFIGURATION, METHOD FOR FABRICATING IT AND METHODS FOR OPERATING IT

(75) Inventors: Franz Hofmann, München; Wolfgang Krautschneider, Hohenthann; Wolfgang Rösner, München; Lothar Risch, Neubiberg; Till Schlösser, München; Paul-Werner Basse, Wolfratshusen, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/213,724

(22) Filed: Dec. 17, 1998

(30) Foreign Application Priority Data

Dec. 17, 1997 (DE) ............................................... 197 56 183

(51) Int. Cl.[7] ................................................ H01L 27/108
(52) U.S. Cl. ....................... 257/296; 257/306; 257/303; 365/149; 365/182
(58) Field of Search .............................. 257/296, 5, 312, 257/303, 306; 365/149, 182

(56) References Cited

U.S. PATENT DOCUMENTS

| | | |
|---|---|---|
| 4,168,538 | 9/1979 | Meusburger . |
| 5,363,326 * | 11/1994 | Nakajima .............................. 365/149 |
| 5,410,169 * | 4/1995 | Yamamoto et al. .................. 257/301 |
| 5,414,289 * | 5/1995 | Fitch et al. ............................ 257/329 |
| 5,907,170 * | 5/1999 | Forbes et al. ......................... 257/296 |
| 5,955,757 * | 9/1999 | Jen et al. .............................. 257/296 |
| 5,990,509 * | 11/1999 | Burns, Jr. ............................. 257/296 |
| 6,072,209 * | 6/2000 | Noble et al. .......................... 257/296 |

FOREIGN PATENT DOCUMENTS

| | | |
|---|---|---|
| 43 12 651 C2 | 4/1996 | (DE) . |
| 195 19 160 C1 | 9/1996 | (DE) . |
| 196 19 160 C1 | 9/1996 | (DE) . |
| 197 01 003 A1 | 11/1997 | (DE) . |

OTHER PUBLICATIONS

"A Surrounding Gate Transistor (SGT) Gain Cell For Ultra High Density DRAMS" (Terauchi et al.), VLSI–Symposium Digest Technology Paper, 1993, pp. 21–22.

"An Experimental 1.5–V 64–Mb DRAM" (Nakagome et al.), IEEE Journal of Solid State Circuits, vol. 26, No. 4, Apr. 1991.

\* cited by examiner

*Primary Examiner*—Tom Thomas
*Assistant Examiner*—Donghee Kang
(74) *Attorney, Agent, or Firm*—Herbert L. Lerner; Laurence A. Greenberg; Werner H. Stemer

(57) ABSTRACT

A memory cell configuration contains a multiplicity of memory cells in a semiconductor substrate. Each of the memory cells has a selection transistor connected between a bit line and a storage element. The memory cells can each be driven via a first word line and a second word line, the first word line and the second word line crossing one another. The memory cell configuration is, in particular, a DRAM configuration.

10 Claims, 20 Drawing Sheets

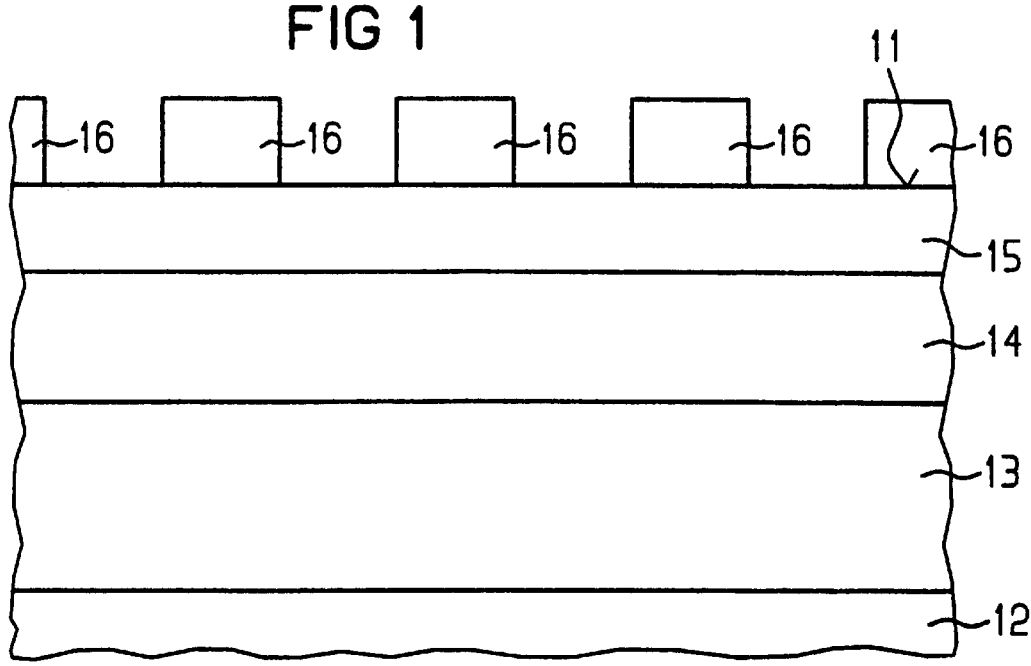
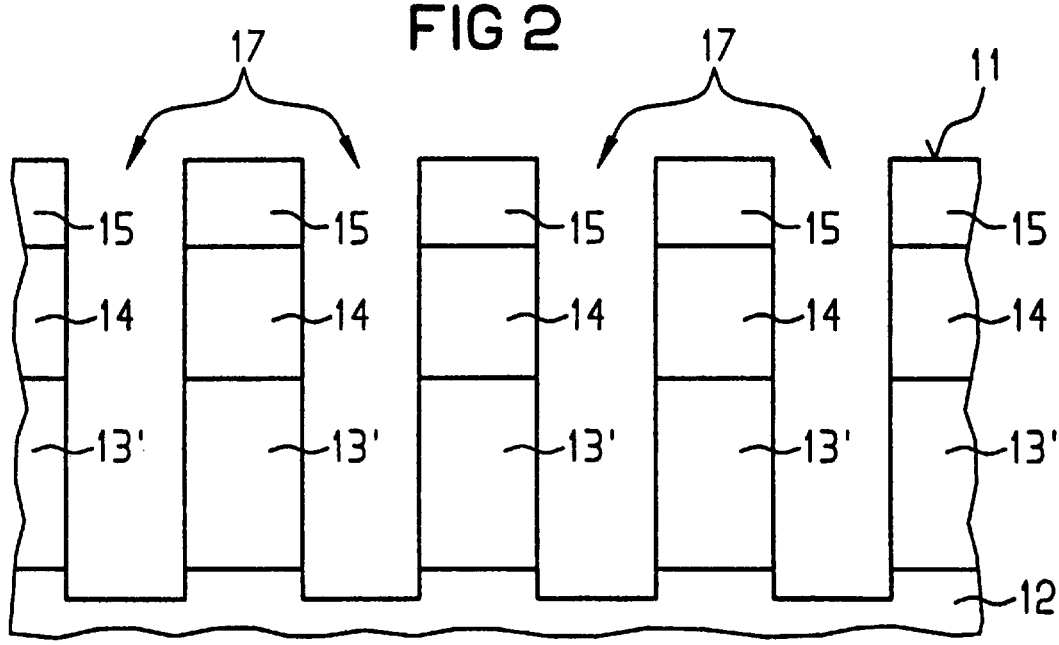

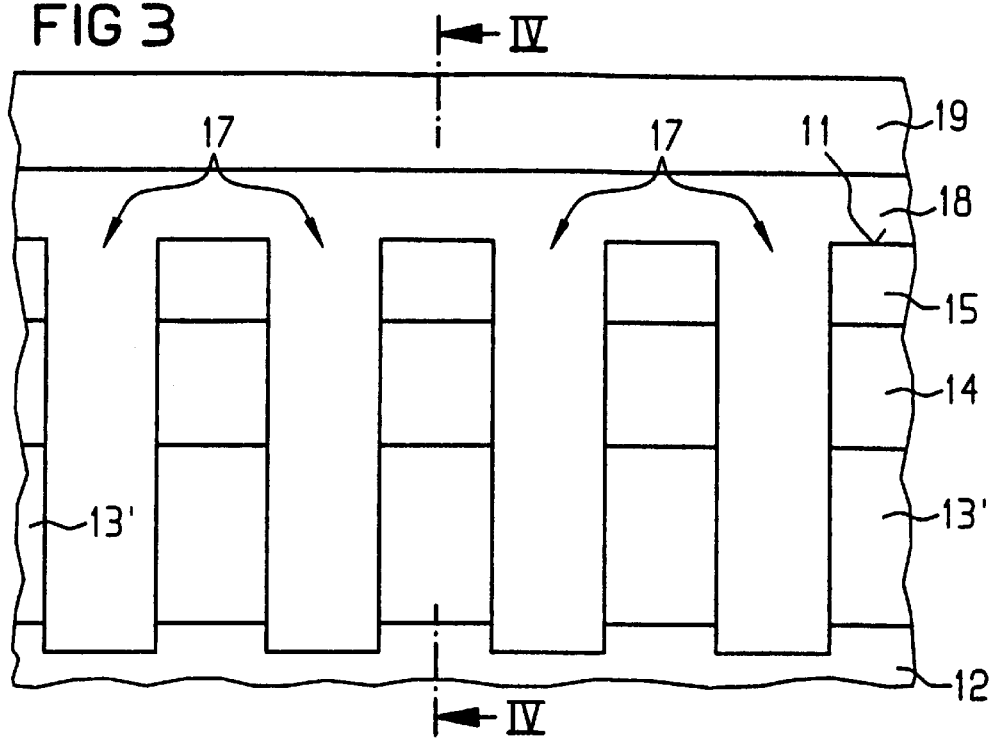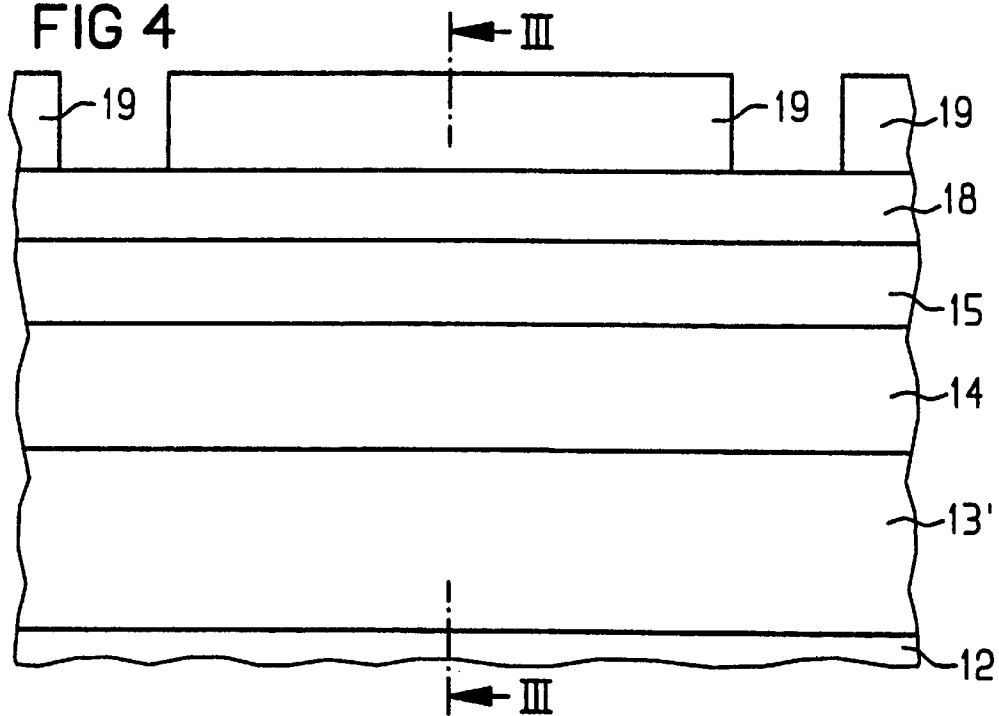

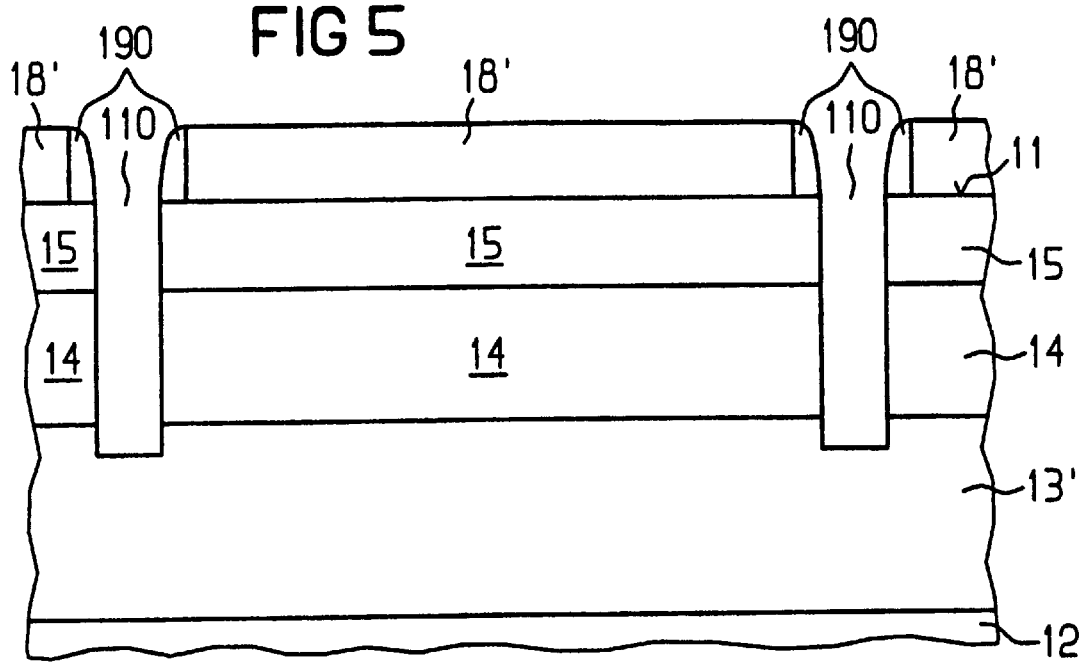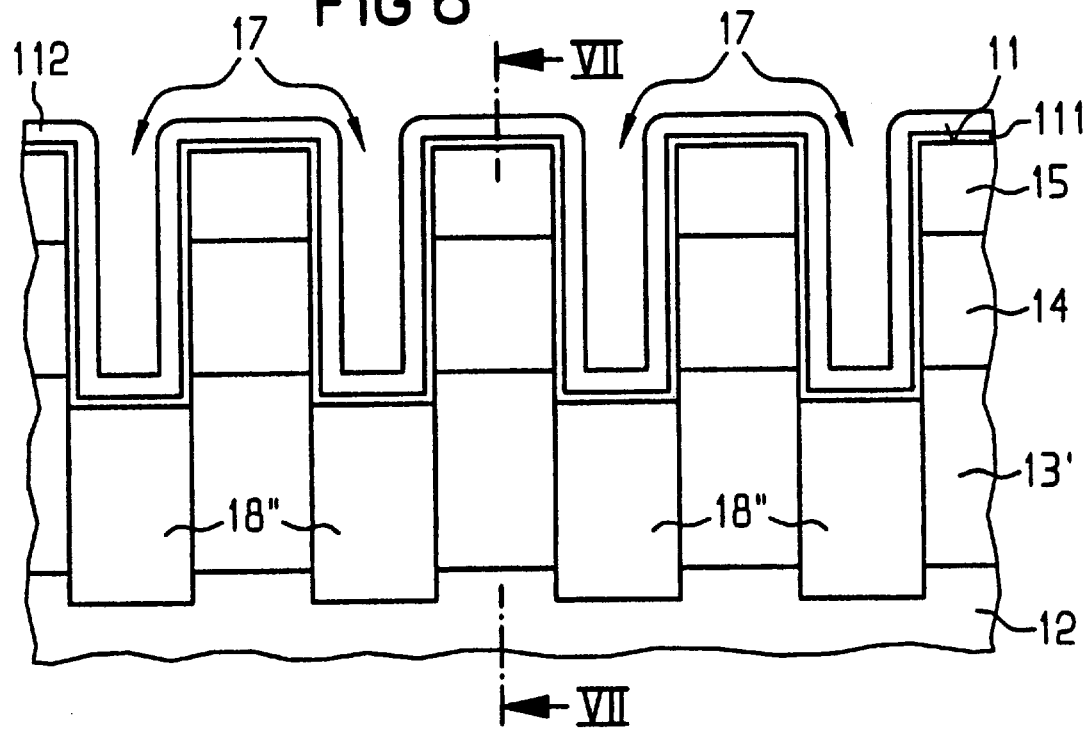

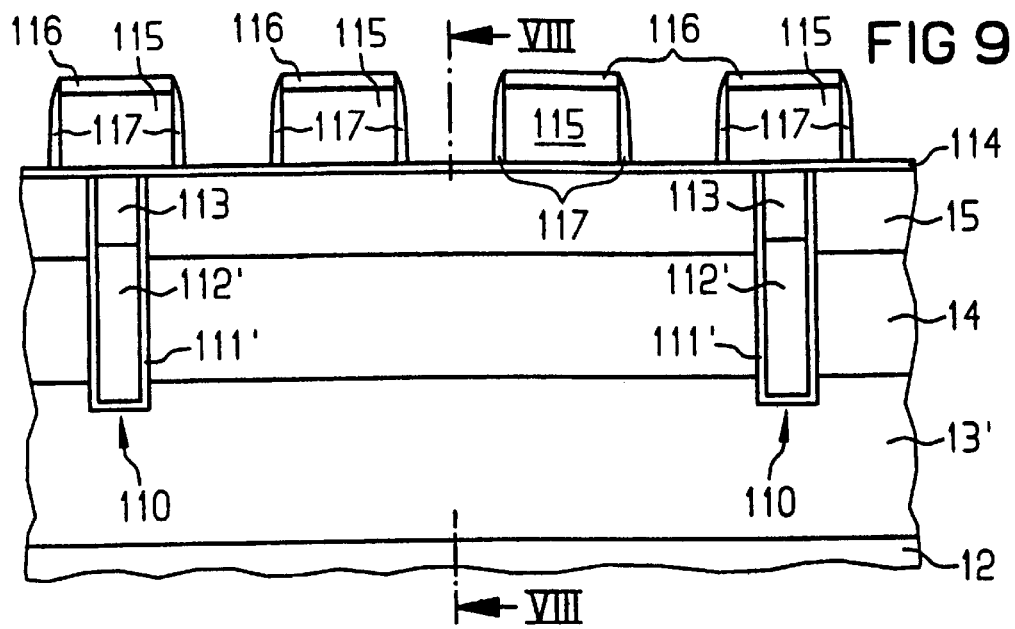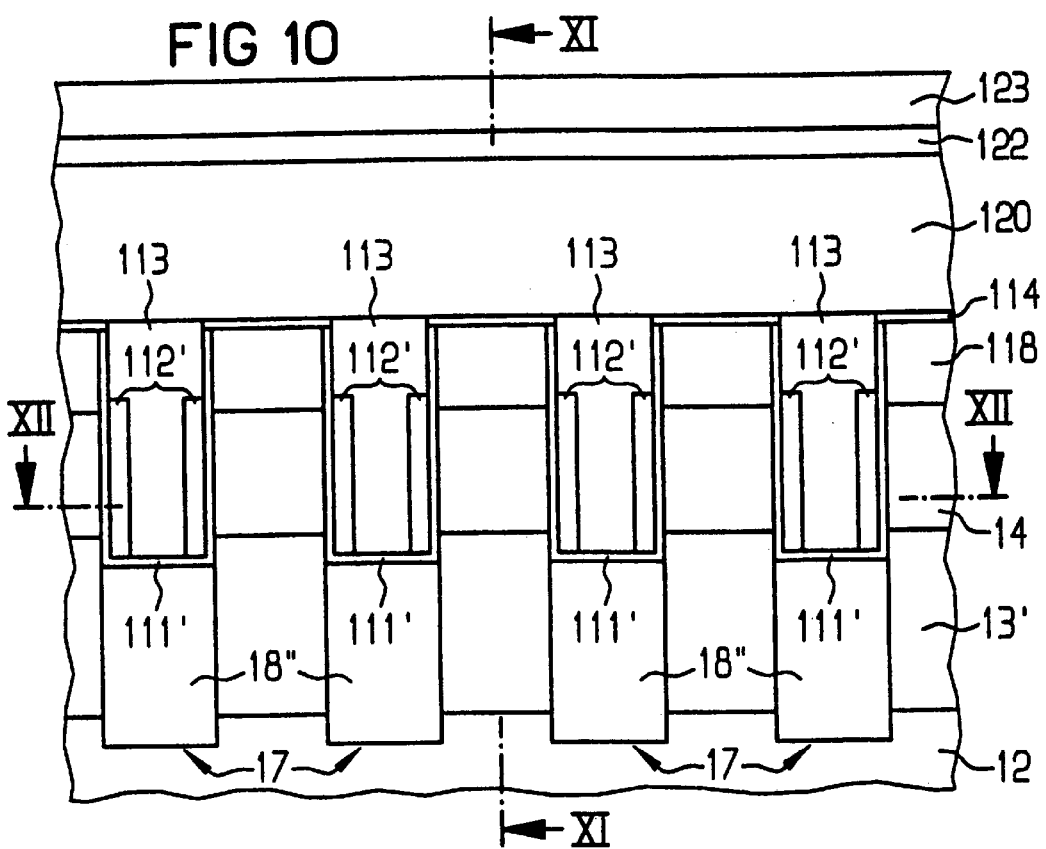

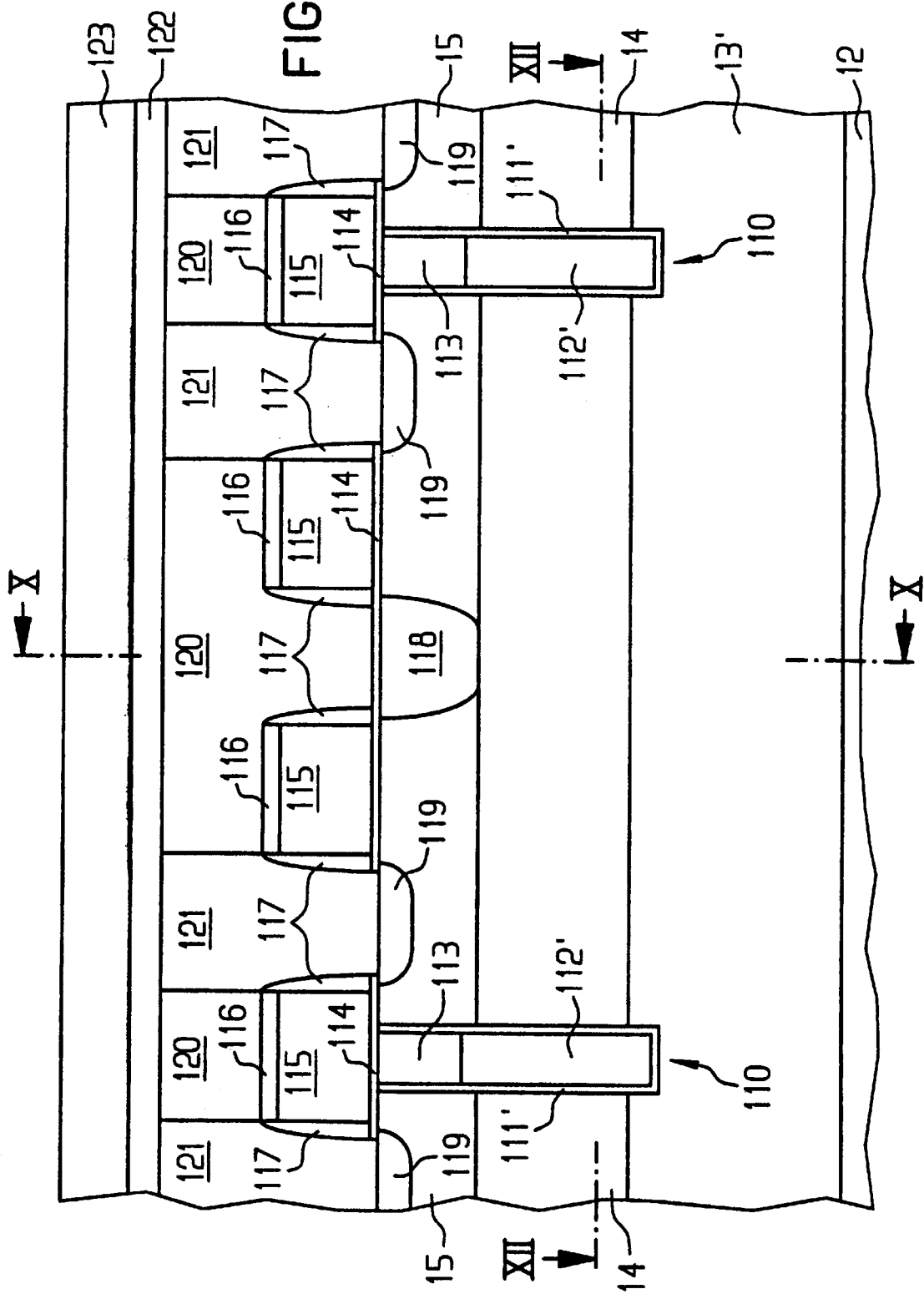

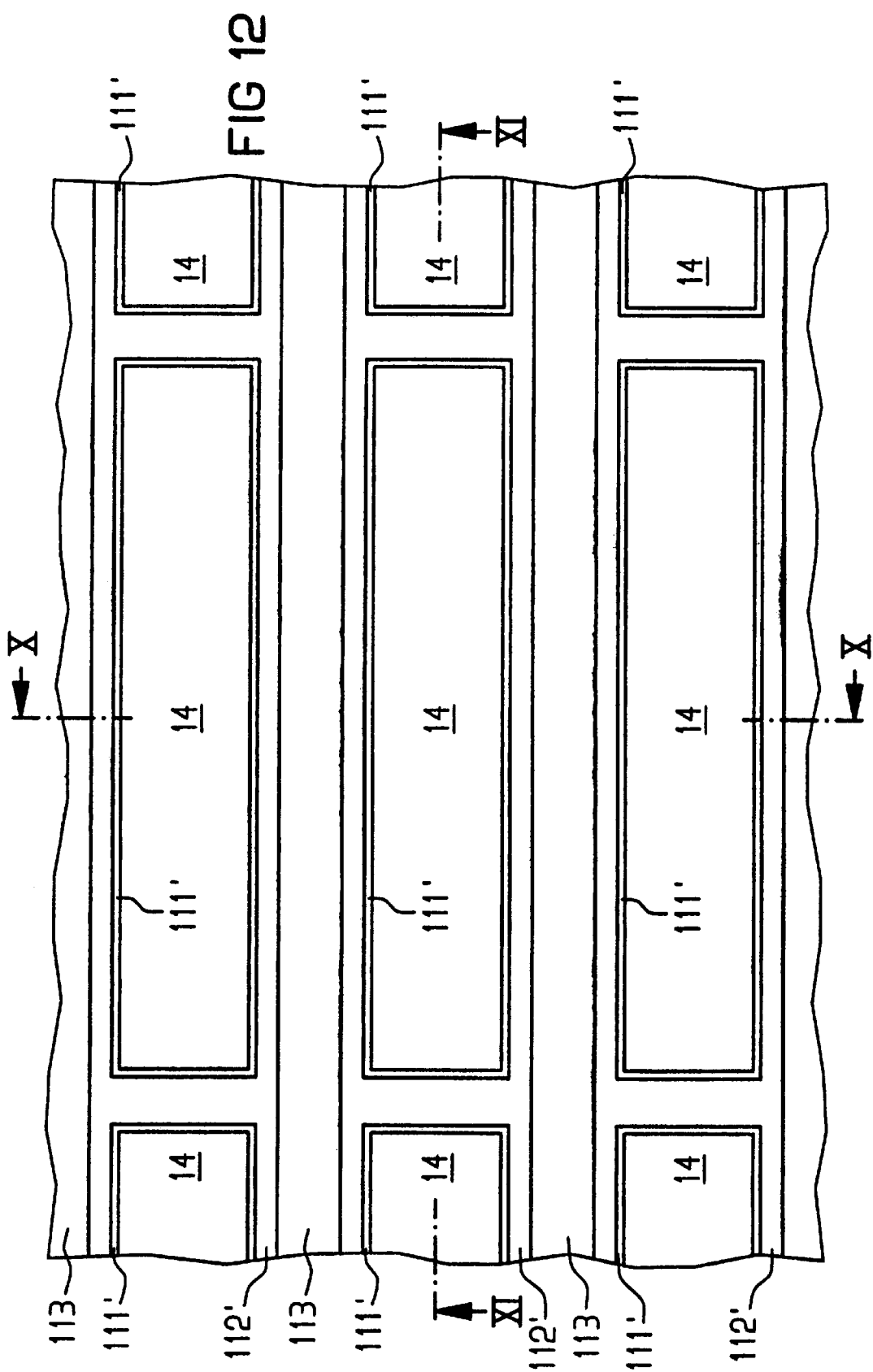

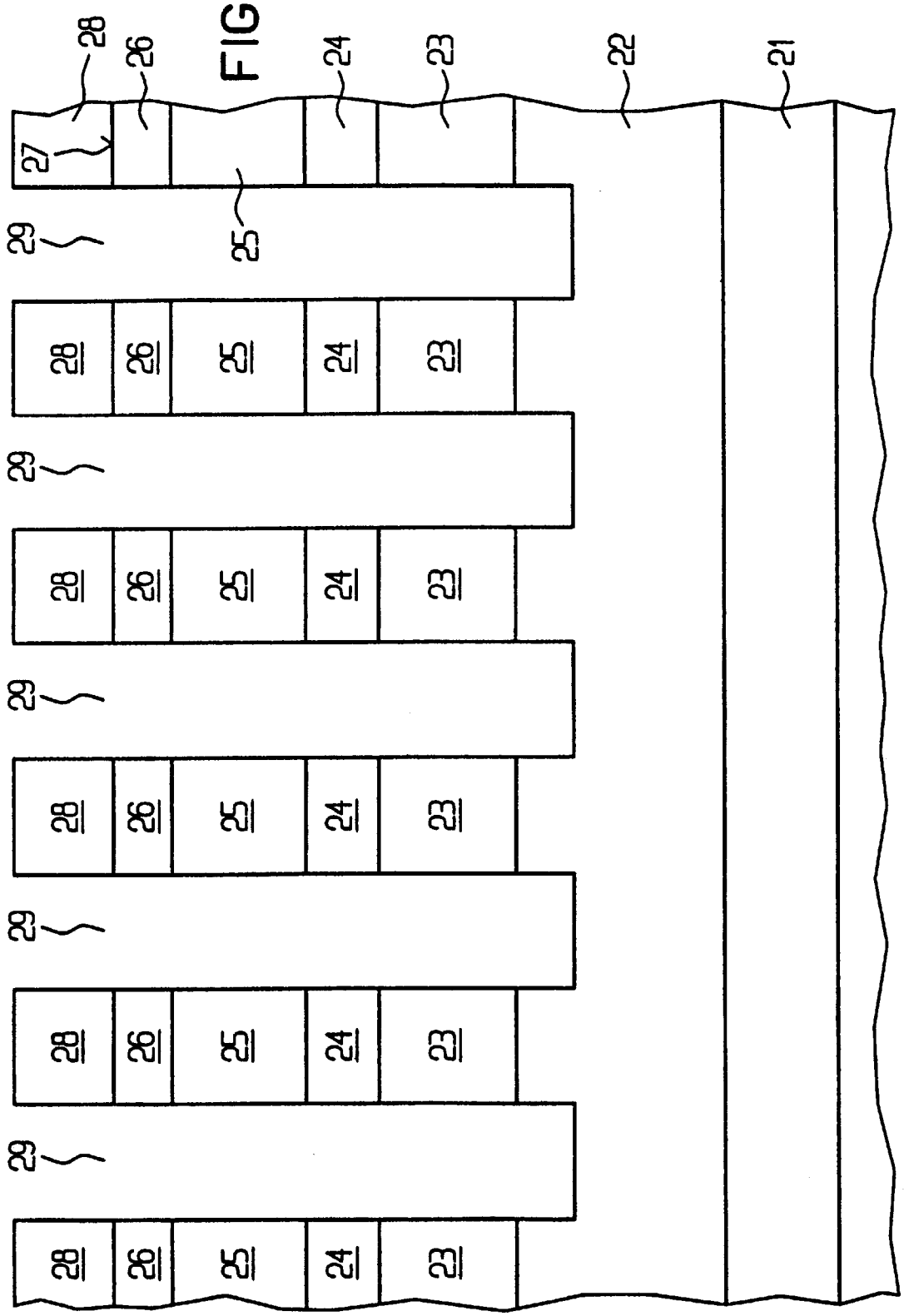

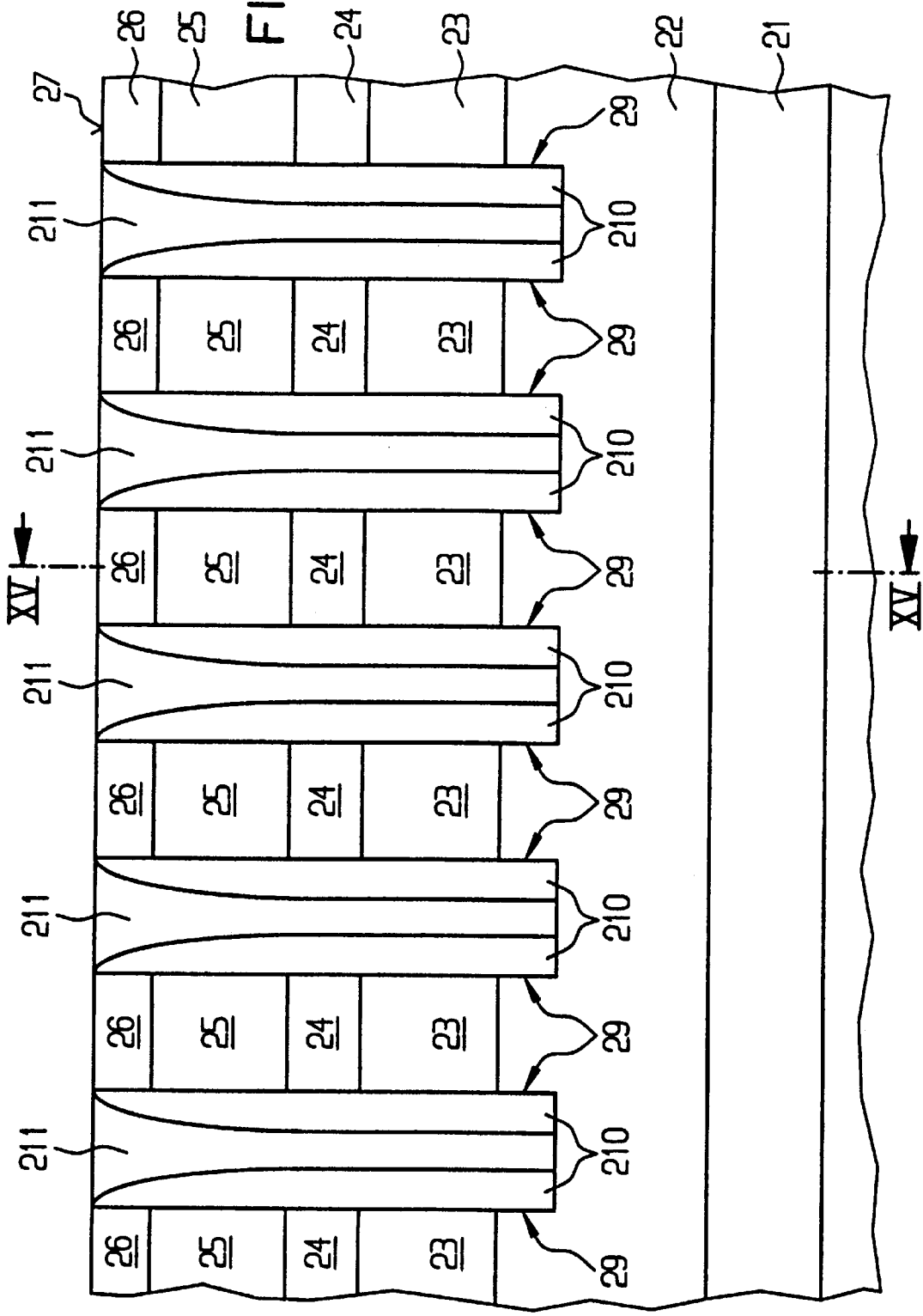

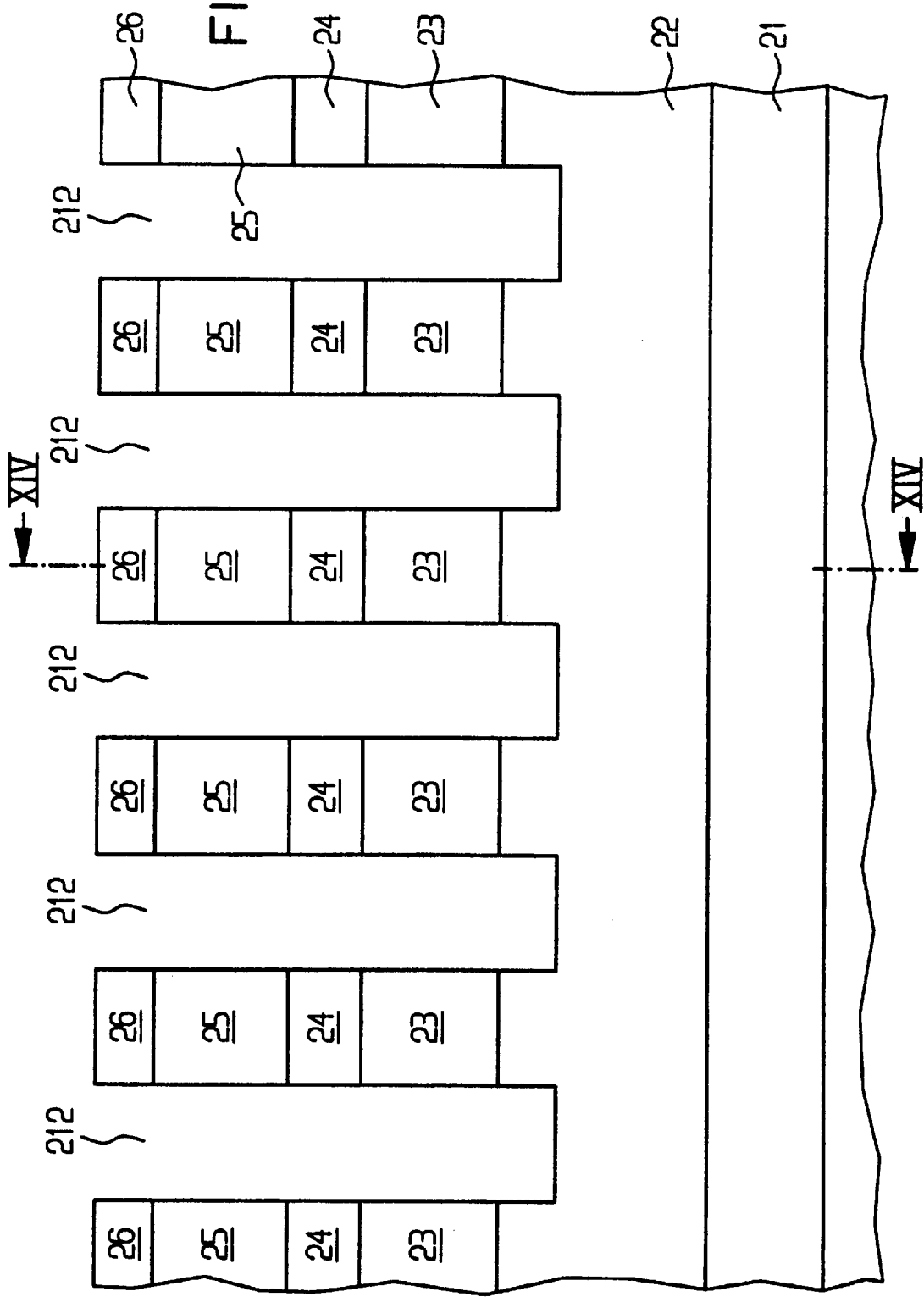

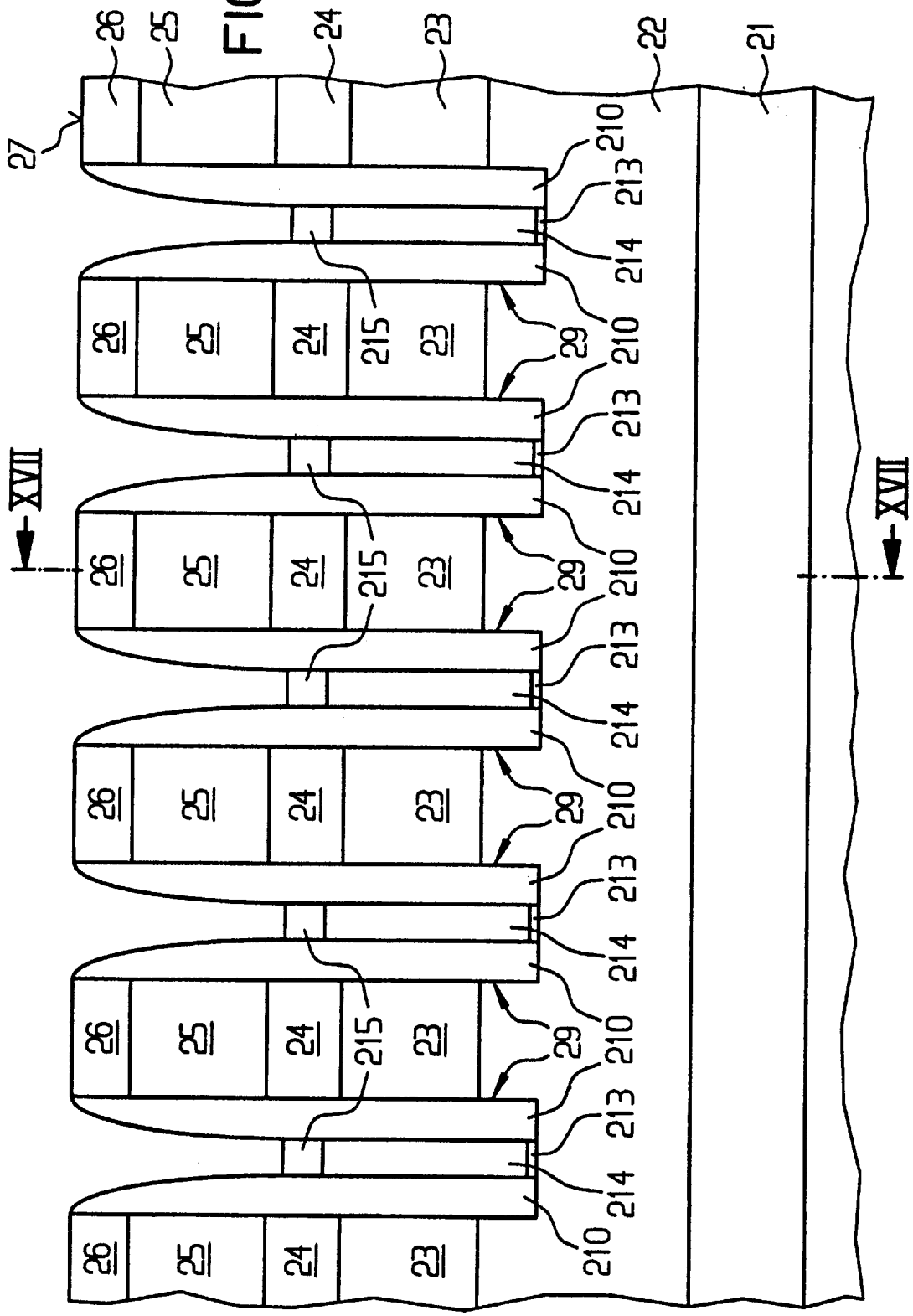

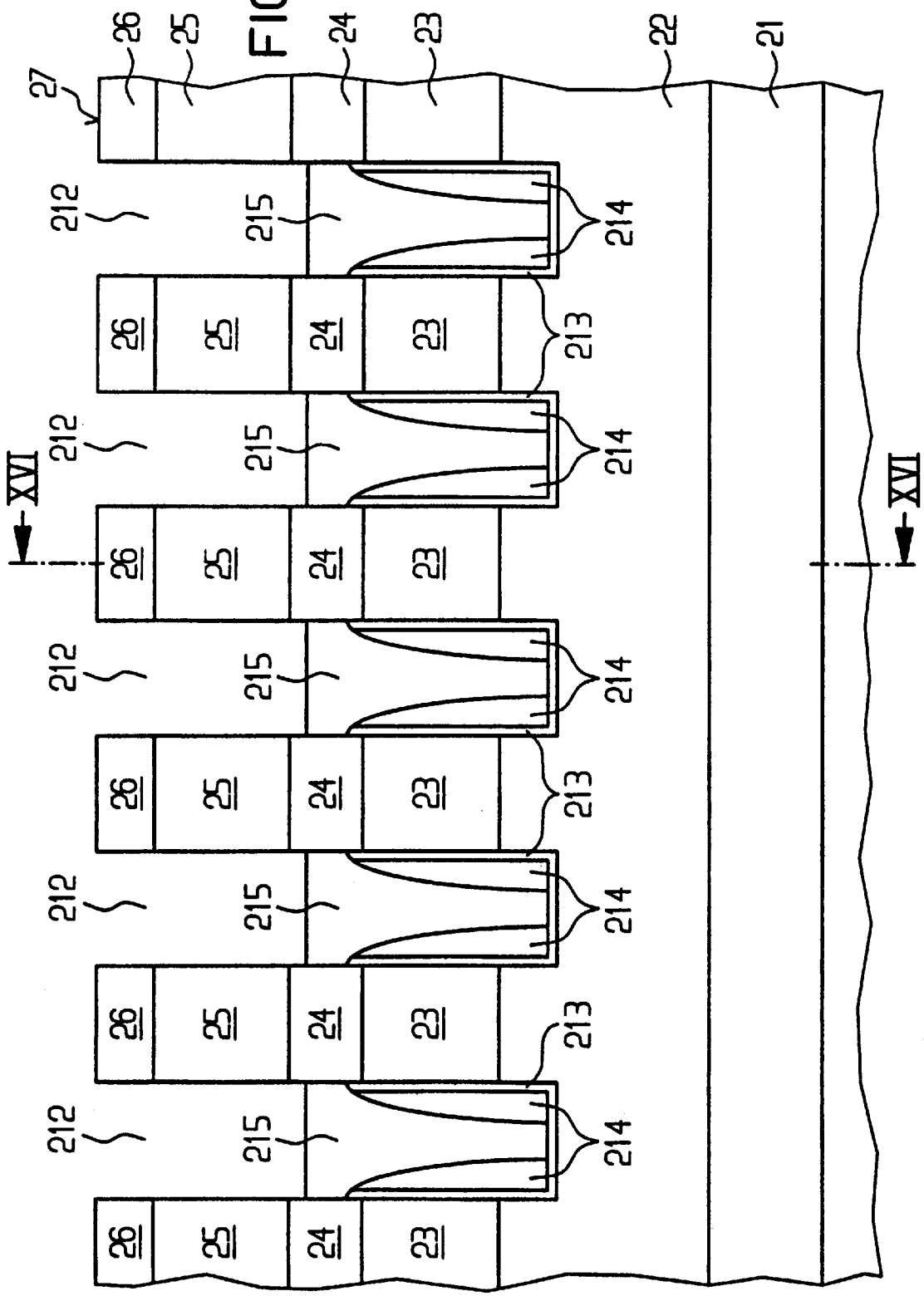

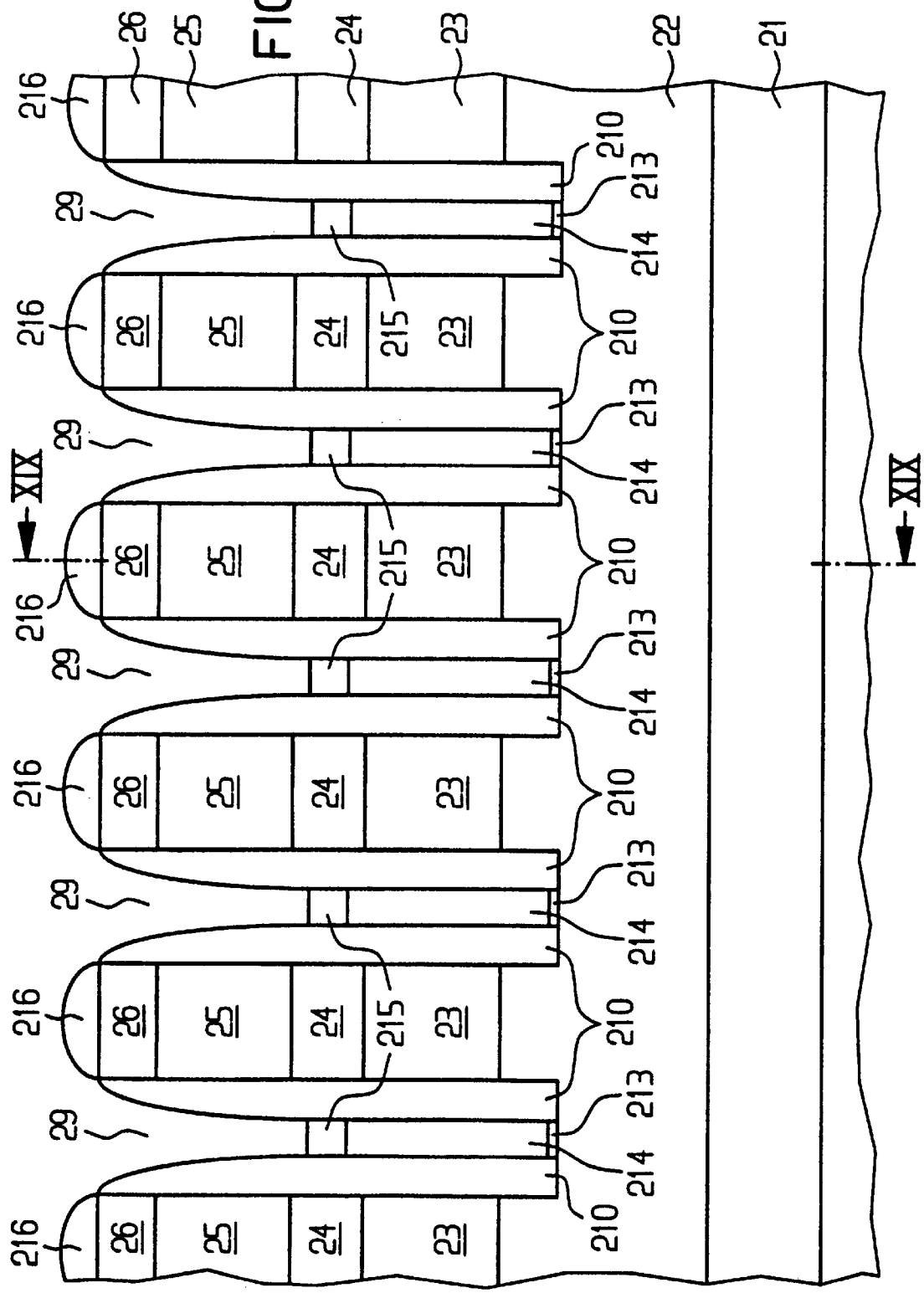

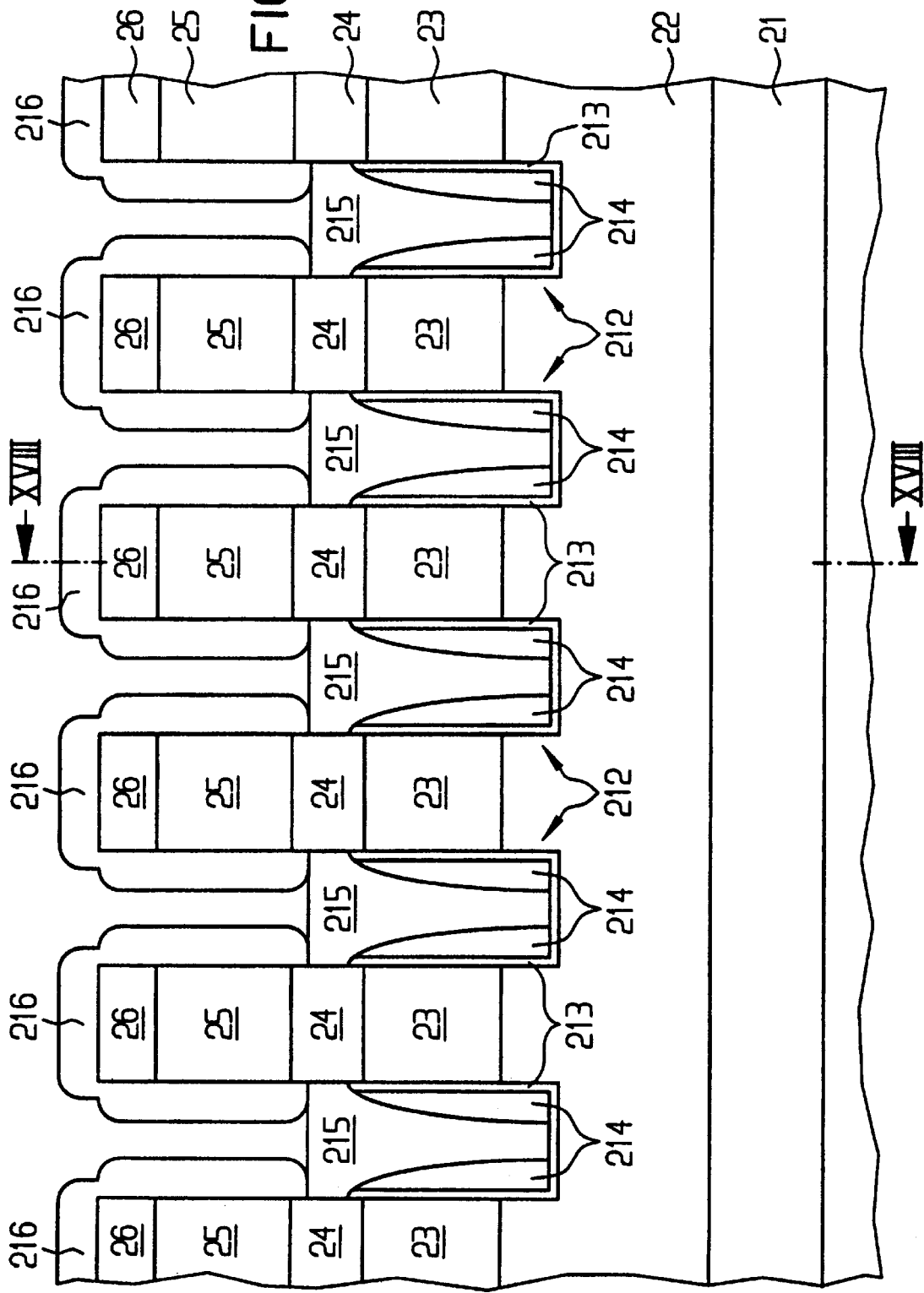

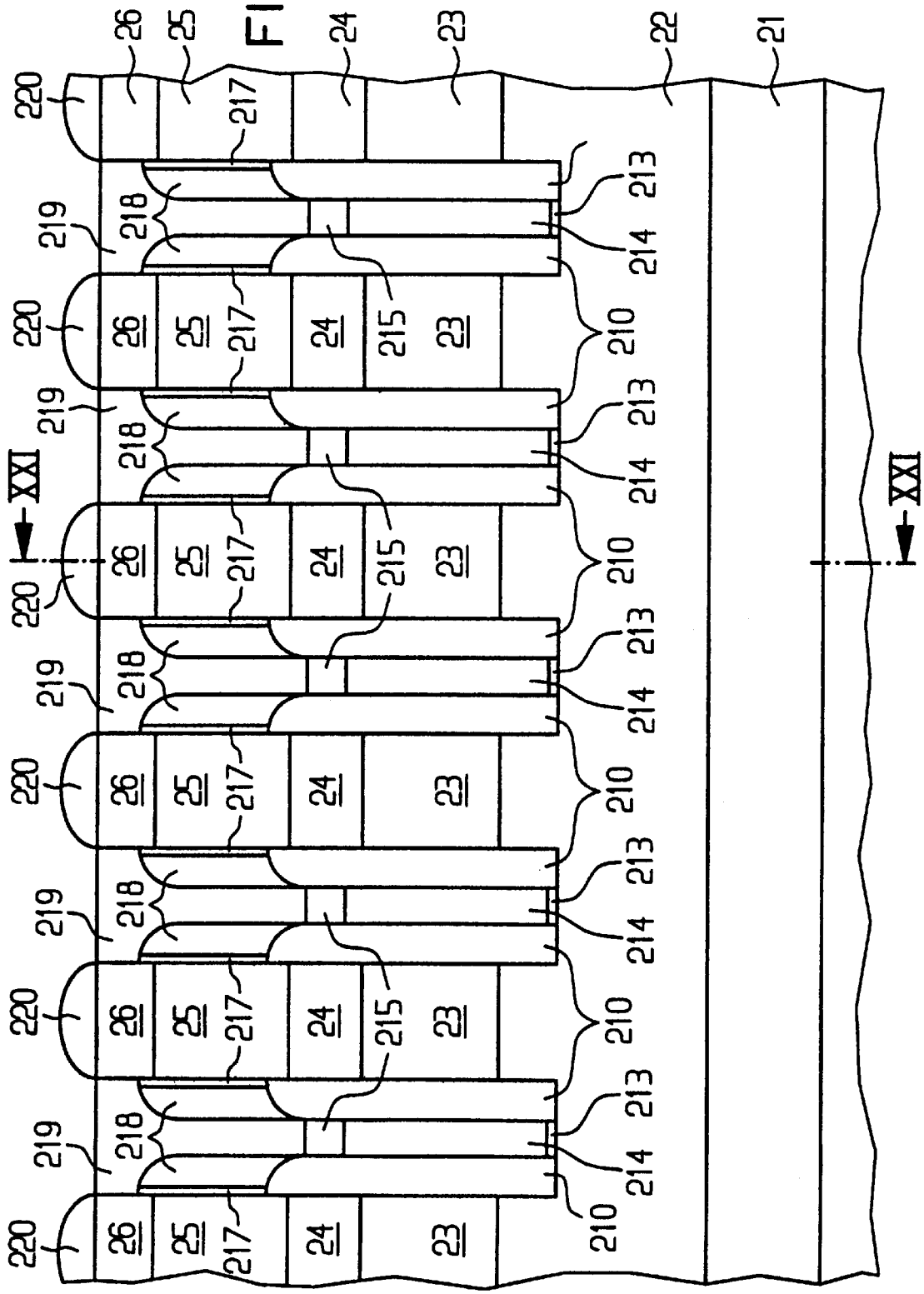

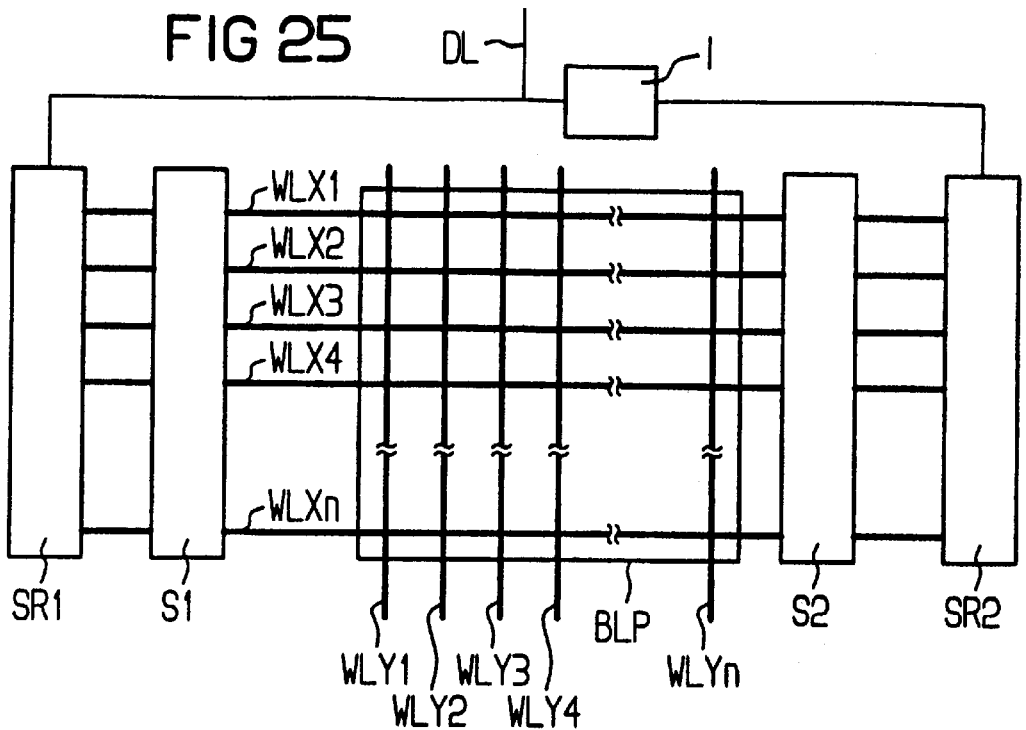
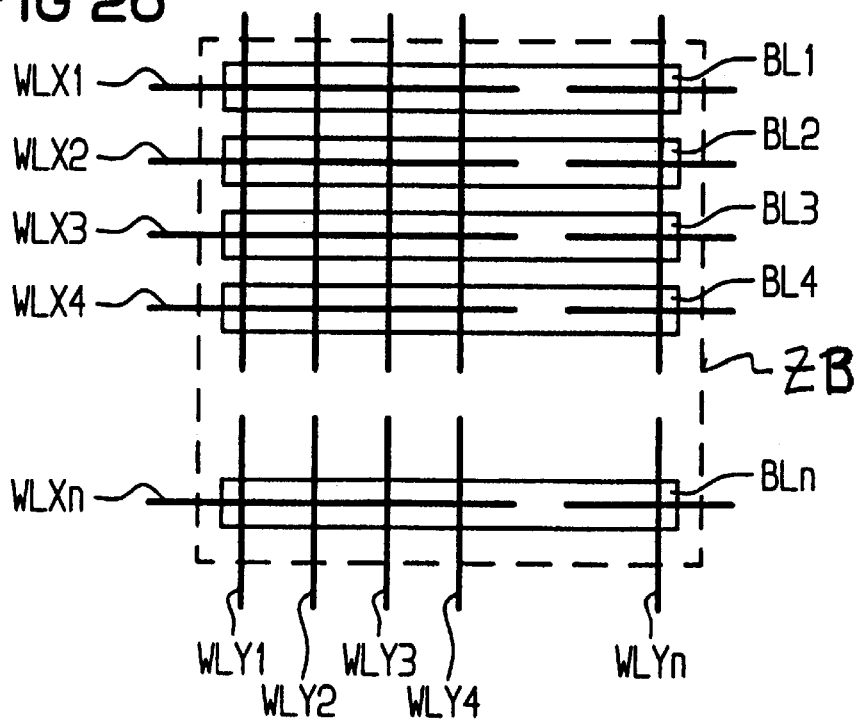

MEMORY CELL CONFIGURATION, METHOD FOR FABRICATING IT AND METHODS FOR OPERATING IT

BACKGROUND OF THE INVENTION

Field of the Invention

Memory cell configurations, in particular DRAM configurations, ROM configurations, EPROM configurations and EEPROM configurations, have a multiplicity of memory cells that are usually disposed in the form of a matrix. In this case, the individual memory cells can each be driven via a bit line and a word line. The memory cells each have a storage element in which information is stored. The information is stored, for example, by a charge stored in a storage capacitance, by a charge stored on a floating gate, or by properties of a transistor, for example the threshold voltage, or by the presence or absence of a conductive connection to the bit line.

In order to read out the information, the individual memory cells are driven sequentially via the associated word line and bit line and the information is read out by voltage or current evaluation (see, for example, Y. Nakagome et al., IEEE Journal of Solid-State Circuits, Vol. 26, No. 4, 1991, pages 465 to 470). With regard to the reading speed, current evaluation is preferable to voltage evaluation but it requires an increased outlay in terms of circuitry. In order to accelerate the reading operation, it is frequently the case that a plurality of memory cells, for example 256, are combined to form a cell block. The individual cell blocks are then read out in parallel. However, the read-out operation in the individual cell block is still carried out sequentially.

In electrically writable memory cell configurations, for example DRAM configurations or EEPROM configurations, in order to write in information, the respective memory cell is likewise driven via the associated bit line and the word line. At the same time, a voltage level corresponding to the information to be written in is applied to the bit line. The information is written sequentially to all the memory cells. In this case, the bit line must each time undergo charge reversal from one voltage state to the other voltage state. This is associated with a consumption of electrical power which is found to be disturbing particularly when the memory cell configuration is used in mobile equipment such as, for example, mobile telephones, notebook computers, database computers or PDA (personal digital assistant).

In DRAM configurations, moreover, the problem arises that the stored information must be refreshed again at regular time intervals. For this purpose, the information is initially read sequentially from the memory cells and then written back. An undesirable power consumption occurs in this case, too.

A further problem in the context of DRAM configurations is the storage density, which increases from memory generation to memory generation. Associated with this is the requirement for an increased packing density, that is to say a reduction in the space requirement per memory cell. German Patent DE 19 519 160 C1 discloses a DRAM cell configuration which can be fabricated with a memory cell area of $4F^2$, where F is the minimum structure size that can be fabricated using the respective technology. In this case, a vertical MOS transistor is provided for each memory cell, the first source/drain region of the transistor is connected to a storage node of a storage capacitor. A channel region of the transistor is enclosed annularly by a gate electrode, and the second source/drain region of the transistor is connected to a buried bit line. The gate electrodes of neighboring vertical MOS transistors along a word line adjoin one another and jointly form the word line.

SUMMARY OF THE INVENTION

It is accordingly an object of the invention to provide a memory cell configuration, method for fabricating it and methods for operating it which overcome the above-mentioned disadvantages of the prior art devices and methods of this general type, which can be driven in an improved way. In particular, the intention is to be able to fabricate the memory cell configuration with a storage density as is required in the gigabit generations.

With the foregoing and other objects in view there is provided, in accordance with the invention, a memory cell configuration, including: a semiconductor substrate having a main surface; a multiplicity of memory cells disposed in the semiconductor substrate, the memory cells each having a storage element and at least one selection transistor disposed vertically to the main surface of the semiconductor substrate and connected to the storage element; and a first word line and a second word line crossing one another and driving the memory cells.

A semiconductor substrate having a multiplicity of memory cells is provided. The memory cells each have at least one selection transistor that is vertical with respect to a main surface of the semiconductor substrate and is connected to a storage element. The selection transistor is preferably connected between a bit line and the storage element. However, the bit lines may also be connected up differently. The memory cells can each be driven via a first word line and a second word line, the first word line and the second word line crossing one another. A memory cell is driven only via the first word line and the second word line. As a result, bit lines can be read out in parallel.

In the case of an electrically writable memory cell configuration, the memory cells are likewise driven in each case via the first word line and the second word line. The bit line is used only for the application of the voltage level corresponding to the information, and not for the purpose of driving. Therefore, in order to write in an item of information corresponding to a predetermined voltage level, it is possible to apply the predetermined voltage level to all the bit lines. Those memory cells in which the associated item of information is supposed to be stored are driven via the first word lines and the second word lines. This information is written to all the corresponding memory cells in a clock cycle. In order to write in a digital information item, therefore, two operations are sufficient: firstly, parallel writing in of a "one" and, secondly, parallel writing in of a "zero". As a result, the writing operation is considerably accelerated in comparison with the prior art. Furthermore, the bit line must undergo charge reversal only as often as corresponds to the number of different information items. In the case of the digital information item, the bit line only has to undergo charge reversal twice. The power consumption is thereby reduced.

In the case of a DRAM configuration, this is also utilized for the refreshing of the information. In this case, the stored information is preferably read out via a shift register. The data word stored in the shift register is subsequently used to drive the first word lines and the second word lines, the bit line being put at the respective voltage levels.

As a result of the significantly smaller number of necessary charge-reversal operations of the bit line in comparison with the prior art, the power consumption in the course of writing in and also in the course of refreshing information is distinctly reduced.

A suitable semiconductor substrate is, in particular, a monocrystalline silicon wafer or the monocrystalline silicon layer of an SOI substrate.

All storage elements that are customarily used in memory cell configurations are suitable as the storage element. In particular, suitable storage elements are those which have MOS transistors having different electrical properties, as are frequently used in ROM configurations, line interruptions, as are used in ROM configurations, fuses, MOS transistors with floating gate and also storage capacitances.

It lies within the scope of the invention to configure the memory cell configuration as a DRAM configuration. In this case, not only can the advantage of the faster data access in the course of reading and writing information be utilized but also the advantage of the smaller power consumption in the course of writing and refreshing the information. In the DRAM configuration, the storage element is preferably configured as a storage capacitance, which can be realized either in the semiconductor substrate, in particular as a trench capacitor, or on the main surface of the semiconductor substrate and/or above the main surface of the semiconductor substrate, in particular as a stacked capacitor. Suitable capacitor dielectrics are the customary storage dielectrics, in particular silicon oxide, combinations of silicon oxide and silicon nitride, or high-epsilon dielectrics such as, for example, BST (barium strontium titanate), $Ta_2O_5$ or SBT (strontium bismuth tantalate).

In accordance with a refinement of the invention, a plurality of the memory cells are combined to form a cell block. The memory cells of each cell block are connected to a common bit line. This has the advantage that the bit line resistance is reduced. Furthermore, this results in new degrees of freedom for the configuration of the sense amplifier.

It lies within the scope of the invention for the memory cells each to have a first selection transistor and a second selection transistor, which are connected in series between the bit line and the storage element. In this case, the first selection transistor can be driven by the first word line and the second selection transistor can be driven by the second word line. In this case, with regard to an increased packing density, neighboring memory cells may each have a common first selection transistor and a common first word line. The neighboring memory cells have different second selection transistors and different second word lines. In that case, they can each be driven via the common first word line and the different second word lines.

In accordance with a refinement of the invention, two neighboring memory cells having a common first selection transistor and different second selection transistors are disposed in a semiconductor pillar. The semiconductor pillar adjoins the main surface of the semiconductor substrate and has sidewalls which cross the main surface of the semiconductor substrate. It is defined, in particular, by essentially parallel first trenches and essentially parallel second trenches, which cross one another. The common first selection transistor is configured as a vertical MOS transistor whose gate electrode is disposed at least on one sidewall of the semiconductor pillar. In the region of the main surface, the second selection transistors of the two neighboring memory cells are disposed as planar MOS transistors. The gate electrodes of the second selection transistors are each situated above the main surface of the semiconductor pillar. They are part of the different second word lines. The gate electrode of the common first selection transistor is part of the first word line. The neighboring memory cells are disposed in a semiconductor pillar.

In this refinement of the invention, it is advantageous for the first gate electrode of the common first selection transistor to be formed annularly, with the result that it surrounds the semiconductor pillar. If the semiconductor pillars of neighboring memory cell pairs along one of the first word lines are disposed in such a way that their distance is less than the thickness of the first gate electrodes parallel to the main surface, then the first gate electrodes of neighboring semiconductor pillars adjoin one another and, in this way, form the first word line. Transversely to the first word line, the distance between neighboring semiconductor pillars is greater than twice the thickness of the first gate electrodes parallel to the main surface. In this case, the first word line can be fabricated by self-aligning process steps, that is to say without the use of masks to be aligned.

Furthermore, it lies within the scope of the invention to dispose the first selection transistor and the second selection transistor in each case along at least one sidewall of a semiconductor pillar which adjoins the main surface of the semiconductor substrate and has sidewalls crossing the main surface. The first selection transistor and the second selection transistor are in this case disposed one above the other. A first gate electrode of the first selection transistor and a second gate electrode of the second selection transistor in this case adjoin the respective sidewall of the semiconductor pillar.

It lies within the scope of the invention for the first gate electrode and the second gate electrode in each case to surround the semiconductor pillar annularly in this refinement. The refinement is preferably fabricated by etching first trenches and second trenches in the main surface of the semiconductor substrate. The first trenches in each case run essentially parallel to one another. The second trenches likewise run essentially parallel to one another. The first trenches and the second trenches cross one another. Each two neighboring first trenches and second trenches define one of the semiconductor pillars. Prior to the fabrication of the first gate electrodes, the cross section of the semiconductor pillars is enlarged by at least one auxiliary structure, with the result that the distance between neighboring semiconductor pillars in the direction of the first word lines is smaller than in the direction of the second word lines. In the region of the second word lines, the cross section of the semiconductor pillars is enlarged with the aid of at least one second auxiliary structure such that, in the region of the second word lines, the distance between neighboring semiconductor pillars in the direction of the second word lines is smaller than in the direction of the first word lines. The first word lines and the second word lines are then fabricated in a self-aligned manner for example by depositing a layer and anisotropically etching back the layer in the sense of spacer formation. Since the distance between neighboring semiconductor pillars is smaller in one direction than in the other direction, neighboring gate electrodes adjoin one another in the direction with the smaller distance, whereas they are spaced apart from one another in the direction with the larger distance. In this way, chain-like lines are formed which run parallel to one another. In this refinement, each semiconductor pillar has a memory cell.

It lies within the scope of the invention for the memory cells each to have only one selection transistor, which can be driven via the first word line and the second word line. The selection transistor is realized, in particular, as a MOS transistor which, between source region and drain region, has two gate electrodes which are part of the first word line and part of the second word line, respectively. In this case, use is made of the fact that the leakage field of the first word line and the leakage field of the second word line overlap, with the result that a continuous conductive channel can be switched on by driving via the first word line and the second word line. With regard to the packing density that can be achieved, it is advantageous in this case to dispose the selection transistor on the sidewalls of a semiconductor pillar which is bounded by neighboring first trenches and second trenches, which cross one another, and to dispose the first word line and the second word line on sidewalls of the semiconductor pillar one above the other. If the width and the mutual distance of the first trenches and of the second trenches is in each case a minimum structure size F that can be fabricated, then the memory cell configuration can be realized with an area requirement per memory cell of $4F^2$.

The semiconductor pillars can be formed either by etching the trenches in a semiconductor substrate or by selective epitaxy within openings of an insulation structure in the form of a lattice. The insulation structure in the form of a lattice defines the course of the trenches in the second case.

Since each memory cell can be driven via the first word line and the second word line, the memory cell configuration can be operated by corresponding driving of the first and second word lines in the sense of a folded bit line architecture.

Other features which are considered as characteristic for the invention are set forth in the appended claims.

Although the invention is illustrated and described herein as embodied in a memory cell configuration, method for fabricating it and methods for operating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a sectional view through a semiconductor substrate with a first trench mask according to the invention;

FIG. 2 is a sectional view through the semiconductor substrate after first trench etching;

FIG. 3 is a sectional view through the semiconductor substrate after a formation of a second trench mask;

FIG. 4 is a sectional view taken along the line IV—IV shown in FIG. 3. The section drawn in FIG. 3 is taken along the line III—III shown in FIG. 4;

FIG. 5 is a sectional view of FIG. 4 after a second trench etching;

FIG. 6 is a sectional view of FIG. 3 after a formation of a first dielectric layer and of a first conductive layer;

FIG. 9 is a sectional view taken along the line IX—IX shown in FIG. 8. The section illustrated in FIG. 8 is taken along the line VIII—VIII shown in FIG. 9;

FIG. 10 is a sectional view illustrated in FIG. 8 after the formation of first n+-doped regions and second $n^+$-doped regions and also after a deposition of an intermediate oxide layer, an opening of contacts, and after a formation of a capacitor dielectric and of a capacitor plate;

FIG. 11 is a sectional view taken along the line XI—XI shown in FIG. 10. The section illustrated in FIG. 10 is taken along the line X—X shown in FIG. 11;

FIG. 12 is a sectional view taken along the line XII—XII in FIG. 10 and FIG. 11. The sections illustrated in FIG. 10 and FIG. 11 are taken along the lines X—X and XI—XI, respectively shown in FIG. 12;

FIG. 13 is a sectional view through the semiconductor substrate after the formation of first trenches;

FIG. 14 is a sectional view through the semiconductor substrate illustrated in FIG. 13 after the formation of nitride spacers on the sidewalls of the first trenches and the filling of the first trenches with an $SiO_2$ structure;

FIG. 15 is a sectional view through the semiconductor substrate taken along the line XV—XV shown in FIG. 14 after the formation of second trenches. The section illustrated in FIG. 14 is taken along the line XIV—XIV shown in FIG. 15;

FIG. 16 is a sectional view through the semiconductor substrate shown in FIG. 14 after the formation of a first gate dielectric and of first word lines, which are covered with a second insulation structure;

FIG. 17 is a sectional view through the semiconductor substrate taken along the line XVII—XVII shown in FIG. 16. The section through the semiconductor substrate illustrated in FIG. 16 is taken along the line XVI—XVI shown in FIG. 17;

FIG. 18 is a sectional view as illustrated in FIG. 16 after selective epitaxy for the purpose of forming a second auxiliary structure;

FIG. 19 is a sectional view taken along the line XIX—XIX shown in FIG. 18. The section illustrated in FIG. 18 is taken along the line XVIII—XVIII shown in FIG. 19;

FIG. 20 is a sectional view corresponding to the section illustrated in FIG. 18 after the etching back of the first auxiliary structures, the formation of a second gate dielectric, of second word lines and of a third insulation structure, and also after implantation;

FIG. 25 is a diagrammatic circuit diagram for writing information to a memory cell configuration with first word lines and second word lines; and FIG. 26 is a circuit diagram for the reading a memory cell configuration with the first word lines and the second word lines and buried bit lines in strip form.

Figure 7:
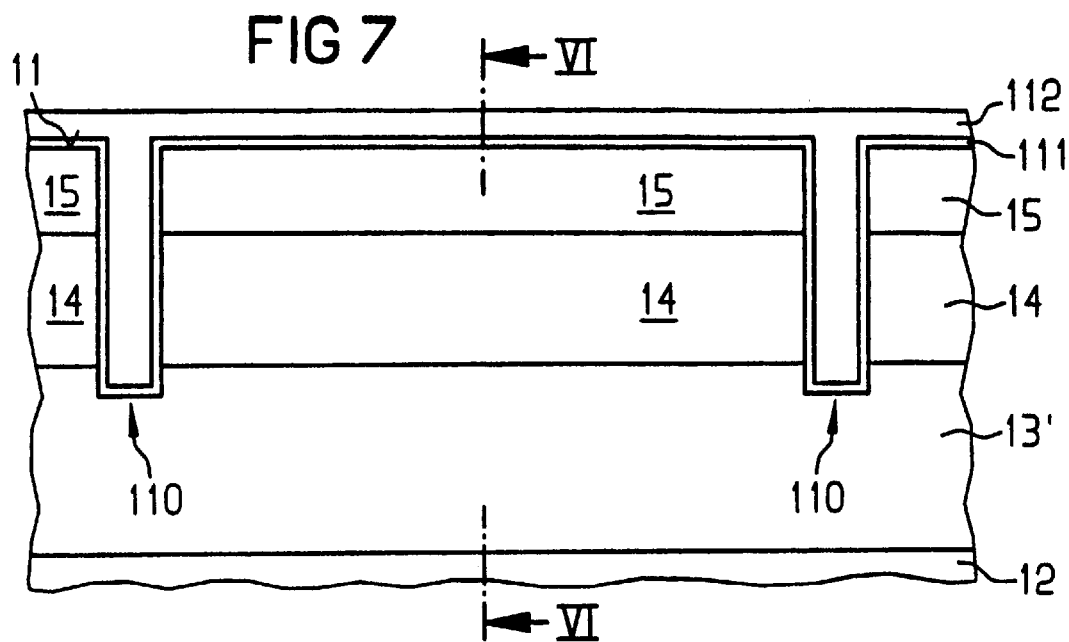
FIG. 7 is a sectional view taken along the line VII—VII shown in FIG. 6. The section illustrated in FIG. 6 is taken along the line VI—VI shown in FIG. 7.

The illustrations in the figures are not true to scale.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a semiconductor substrate having monocrystalline silicon at least in the region of a main surface or area 11 and including a p-doped substrate body 12, an n+-doped silicon layer 13 disposed thereon, a first p-doped layer 14 disposed thereon and a second p-doped silicon layer 15 disposed thereon (see FIG. 1). The p-doped substrate body 12 has a dopant concentration of $10^{16}$ cm$^{-3}$. The n+-doped silicon layer 13 is produced by epitaxial growth to a thickness of 500 nm. It has a dopant concentration of $10^{20}$ cm$^{-3}$. The first p-doped silicon layer 14 and the second p-doped silicon layer 15 are grown epitaxially and together have a thickness of 500 nm. The first p-doped silicon layer 14 has a thickness of 200 nm and a dopant concentration of $10^{17}$ cm$^{-3}$. The second p-doped silicon layer 15 has a thickness of 300 nm and a dopant concentration of $10^{16}$ cm$^{-3}$.

A first trench mask 16 is subsequently formed on the main surface 11 by depositing and structuring an SiO$_2$ layer. The SiO$_2$ layer is deposited to a layer thickness of 150 nm using a TEOS process and is structured with the aid of a photoresist mask by dry etching using CHF$_3$, O$_2$. The first trench mask 16 has openings in strip form which have a width of 250 nm and a mutual distance of 250 nm. The width and the distance in each case correspond to a minimum structure size F that can be fabricated in the technology used.

After the removal of the photoresist mask which has been used to form the first trench mask 16, first trenches 17 (FIG. 2) are etched, the first trench mask 16 being used as etching mask in a dry etching process using HBr, He, O$_2$, NF$_3$. The first trench mask 16 is subsequently removed by a wet-chemical process for example using HF. The depth of the first trenches 17 is 1100 nm. As a result, the first trenches 17 reach right down into the p-doped substrate body 12. Bit lines 13' in strip form are formed in this process from the n+-doped silicon layer 13.

An SiO$_2$ layer 18 is subsequently deposited and completely fills the first trenches 17. The SiO$_2$ layer 18 is deposited to a layer thickness of 200 nm using a TEOS process (see FIG. 3). A photoresist mask 19 having openings in strip form is formed on the surface of the SiO$_2$ layer 18. The openings, in strip form, of the photoresist mask 19 run transversely with respect to the first trenches 17 (see FIG. 3 and FIG. 4). The openings, in strip form, in the photoresist mask 19 have a width of 250 nm and a mutual distance of 1250 nm.

A second trench mask 18' (see FIG. 5) is formed from the SiO$_2$ layer 18 by dry etching using Ar, CF$_4$, CHF$_3$, N$_2$, He. The photoresist mask 19 is subsequently removed. The first trenches 17 remain filled with SiO$_2$ during the structuring of the second trench mask 18'. SiO$_2$ spacers 190 are formed on sidewalls of the second trench mask 18', which sidewalls are perpendicular to the main surface 11, by deposition of an SiO$_2$ layer to a layer thickness of 80 nm using a TEOS process and anisotropic etching using CHF$_3$, O$_2$.

Second trenches 110 are formed by anisotropic dry etching using the second trench mask 18' and the SiO$_2$ spacers 190 (see FIG. 5). The second trenches 110 are etched to a depth of 500 nm. They reach down into the bit lines 13', but without cutting through the bit lines 13'. The second trenches 110 must be deep enough that the first p-doped silicon layer 14 is definitely cut through. The width of the second trenches 110 is 90 nm. It is reduced by the width of the SiO$_2$ spacers 190 in comparison with the width of the openings, in strip form, in the second trench mask 18'.

The SiO$_2$ spacers 190 and the upper region of the second trench mask 18' are subsequently etched selectively with respect to silicon by anisotropic etching using CHF$_3$, O$_2$. In this process, that part of the second trench mask 18' which is situated in the first trenches 17 is etched to an extent such that first insulation structures 18" are formed from the second trench mask 18' in the trenches 17 (see FIG. 6 and FIG. 7). The first insulation structures 18" cover the bottom of the first trenches and reach as far as the upper region of the bit lines 13'. The sidewalls of the first p-doped silicon layer 14, of the second p-doped silicon layer 15 and in the upper region of the bit lines 13' are uncovered in this process. The height of the first insulation structures 18" is about 500 nm.

A first dielectric layer 111 is formed from SiO$_2$ to a layer thickness of 5 nm by thermal oxidation. A conductive layer 112 is applied to the first dielectric layer 111. The conductive layer 112 is formed from in situ-doped polysilicon with a layer thickness of 80 nm. Phosphorus is used as the dopant. The dopant concentration is $10^{21}$ cm$^{-3}$. The conductive layer 112 completely fills the second trenches 110. The first trenches 17 are not filled by the conductive layer 112 (see FIG. 6 and FIG. 7).

Figure 8:
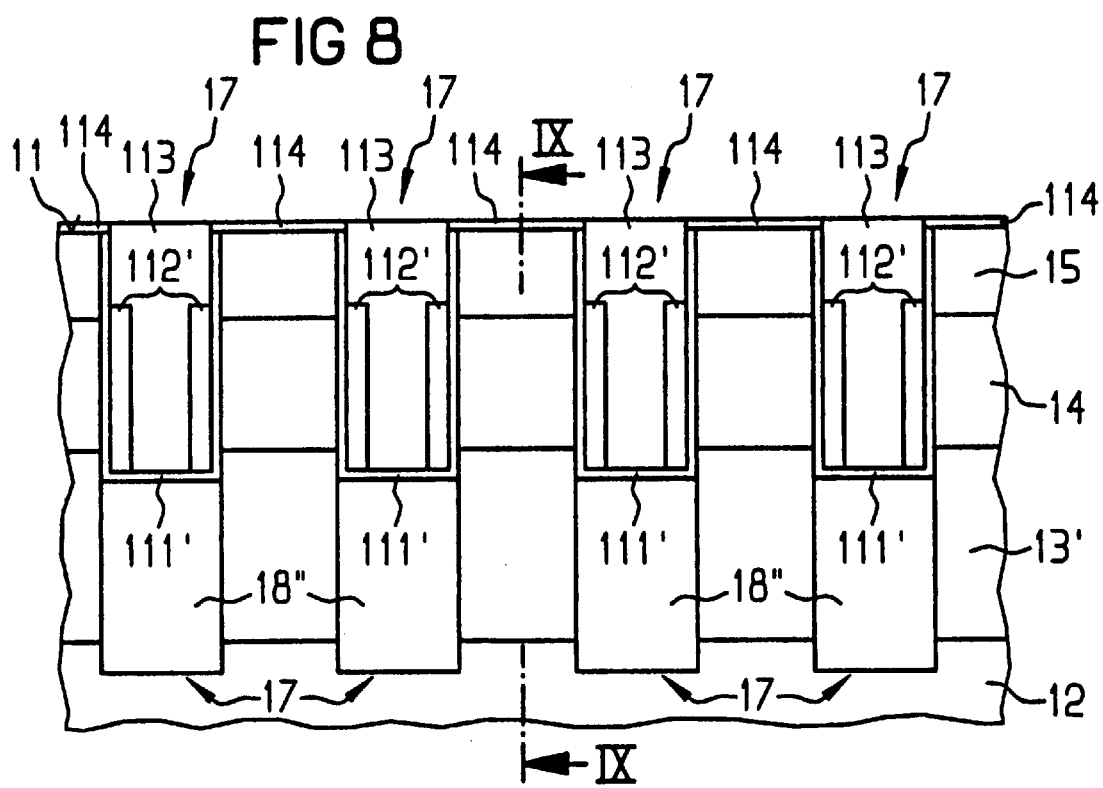
FIG. 8 is a sectional view through the semiconductor substrate illustrated in FIG. 6 after the formation of first word lines, of a second dielectric layer and of second word lines.

The conductive layer 112 is etched selectively with respect to the first dielectric layer 111 by anisotropic etching using He, HBr, Cn,, Cl$_2$F$_6$. In this process, the conductive layer 112 is removed down to a depth of 200 nm below the main surface 11. First word lines 112' are formed from the conductive layer 112 in this process. The height of the first word lines 112' is dimensioned in such a way that it definitely covers the region in which the first dielectric layer 111 covers the sidewalls of the first p-doped silicon layer 14. The first word line 112' is formed from annular elements that each surround one of the semiconductor pillars (the semiconductor pillars being formed by the grid pattern of the first and second trenches). Neighboring annular elements in the direction of the first trenches 17 adjoin one another in this case (see FIG. 8 and FIG. 9). The first trenches 17 and the second trenches 110 are filled with a second insulation structure 113 by depositing and etching back an SiO$_2$ layer. The SiO$_2$ layer is deposited to a layer thickness of 200 nm using a TEOS process. The etching back is effected using CHF$_3$, O$_2$. During the formation of the second insulation structure 113, the main surface 11 is uncovered outside the first trenches 17 and the second trenches 110.

A second dielectric layer 114 is formed from SiO$_2$ to a layer thickness of 5 nm by thermal oxidation. On the second dielectric layer 114, second word lines 115 in strip form are produced and, on top of them, silicon nitride structures 116 in strip form are produced (see FIG. 8 and FIG. 9). The second word lines 115 run parallel to the second trenches 110. In order to form the second word lines 115, the second conductive layer and a silicon nitride layer 116 are deposited and structured in strip form with the aid of a photoresist mask. For this purpose, the following etching process is used: CF$_4$, O$_2$, N$_2$/He, HBr, Cl$_2$, C$_2$F$_6$. The second word lines 115 are formed with a width of 250 nm, a distance of 250 nm, a length of 200 nm and a thickness of 150 nm. The second word lines 115 are formed for example from in situ-doped polysilicon. Phosphorus is suitable as the dopant. The dopant concentration is $10^{21}$ cm$^{-3}$. The silicon nitride structures 116 in strip form have the same dimensions as the second word lines 115 and have a thickness of 50 nm.

Silicon nitride spacers 117 are formed on the sidewalls of the second word lines 115 by deposition of a silicon nitride layer and anisotropic etching of the silicon nitride layer. The silicon nitride layer is deposited to a layer thickness of 30 nm using a CVD process. The etching is effected using CF$_4$, O$_2$, N$_2$. The etching is effected selectively with respect to SiO$_2$.

First n$^+$-doped regions 118 are subsequently formed using a non-illustrated photoresist mask as an implantation mask. The first n$^+$-doped regions 118 are disposed in each case between neighboring first trenches 17, adjoin the main surface 11 and adjoin the interface with the first p-doped silicon layer 14. A first n$^+$-doped region 118 is provided in each semiconductor pillar, which is defined by respectively neighboring first trenches 17 and second trenches 110. The first n$^+$-doped region is situated approximately in the middle between neighboring second trenches 110 (see FIG. 10 and FIG. 11). The first n$^+$-doped regions 118 have a dopant concentration of $10^{21}$ cm$^{-3}$ and a depth of 300 nm. The implantation is effected using phosphorus or using arsenic.

After the removal of the photoresist mask, a further photoresist mask (not illustrated) is formed which is used as an implantation mask for the purpose of forming second n$^+$-doped regions 119. Two n$^+$-doped regions 119 are formed in each semiconductor pillar, which regions are disposed on both sides of the respective first n$^+$-doped region 118 between neighboring second trenches 110. The second p-doped silicon layer 15 adjoins the main surface 11 in each case between the second n$^+$-doped region 119 and the first n$^+$-doped region 118. The depth of the second n$^+$-doped regions 119 is 100 nm. It is less than the thickness of the second doped silicon layer 15. The implantation is effected using phosphorus. One of the second word lines 115 runs on the surface of the semiconductor pillars between the first n$^+$-doped region 118 and each of the second n$^+$-doped regions 119 (see FIG. 11). An SiO$_2$ layer 120 is subsequently deposited and planarized by chemical mechanical polishing (CMP). The planar surface of the SiO$_2$ layer 120 is disposed about 500 nm above the main surface 11.

Contact holes to the second n$^+$-doped regions 119 are subsequently opened in the SiO$_2$ layer 120 using a photoresist mask and anisotropic etching using Ar, CF$_4$, CHF$_3$, for example. The contact holes are provided with storage nodes 121. For this purpose, a doped polysilicon layer is deposited over the whole area and planarized by chemical mechanical polishing. The storage nodes 121 are doped in situ with phosphorus with a dopant concentration of $10^{21}$ cm$^{-3}$.

Although a photoresist mask produced by photolithography is necessary in order to open the contact holes for the storage nodes 121, the alignment of the photoresist mask is noncritical since the second word lines 115 are completely covered with silicon nitride and the contact hole etching is effected selectively with respect to silicon nitride and, consequently, misalignment of the photoresist mask is non-critical.

Afterwards, a capacitor dielectric 122 made of SiO$_2$, of a triple layer made of SiO$_2$, Si$_3$N$_4$ and SiO$_2$ or of a ferroelectric layer made of BST (barium strontium titanate) or SBT (strontium bismuth tantalate) is deposited. The capacitor dielectric 122 is deposited to a layer thickness of 4 nm. A capacitor plate 123 made of doped polysilicon is applied to the capacitor dielectric 122. The capacitor plate 123 is formed by in situ-doped deposition of polysilicon with phosphorus as dopant and a dopant concentration of $10^{21}$ cm$^{-3}$.

In this exemplary embodiment, each semiconductor pillar which is defined by in each case two neighboring first trenches 17 and second trenches 110 includes two memory cells. The two memory cells have a common first selection transistor, which is formed from the bit line 13', the first n$^+$-doped region 118 as source/drain regions and the intermediate part of the first p-doped silicon layer 14 as the channel region, the first gate dielectric 111' and the first word line 112'. Each of the memory cells has, furthermore, a second selection transistor, which is in each case formed from the first n$^+$-doped region 118 and one of the second n+-doped regions 119 as source/drain regions as well as the intermediate part of the second p-doped silicon layer 15 as channel region, the second dielectric layer 114 as gate dielectric and the second word line 115 arranged above the channel region. The two second selection transistors are connected in series with the common first selection transistor via the first n$^+$-doped region 118. The second word lines 115 disposed above the second trenches 110 have no electrical function in this memory cell configuration. Their function consists in enabling the contact hole etching for the storage nodes 121 selectively with respect to silicon nitride.

The threshold voltage of the common first selection transistor is set by way of the doping of the first p-doped silicon layer 14. The threshold voltage of the second selection transistors is set by way of the doping of the second p-doped silicon layer 15. Alternatively, the threshold voltage of the second selection transistors can be set by specific channel implantation.

The first word lines 112' run transversely with respect to the second word lines 115 and have annular elements which in each case surround one of the semiconductor pillars (see FIG. 12).

If the first trenches 17 are formed with a width of a minimum structure size F that can be fabricated and a distance of F and the second trenches 110 are formed with a width of F minus the width of the SiO$_2$ spacers 190 and a distance between neighboring second trenches 110 of 5F plus the width of the SiO$_2$ spacers 190, then a space requirement of 12F$^2$ results for each two memory cells. In other words, the memory cell configuration can be fabricated with an area requirement per memory cell of 6F$^2$.

In a second exemplary embodiment, use is made of a semiconductor substrate including a silicon on insulator (SOI) substrate 21, on top of which the following are grown epitaxially: a first n$^+$-doped silicon layer 22, a first p-doped silicon layer 23, a second n$^+$-doped silicon layer 24, a second p-doped silicon layer 25 and a third n$^+$-doped layer 26. The third n$^+$-doped layer 26 adjoins a main surface 27 (see FIG. 13). The first n$^+$-doped silicon layer 22 is formed to a layer thickness of 300 nm with the dopant As and a dopant concentration of $1 \times 10^{20}$ cm$^{-3}$. The first p-doped silicon layer 23 is formed to a layer thickness of 200 nm with a dopant concentration of $1 \times 10^{18}$ cm$^{-3}$ of boron. The second n$^+$-doped layer 24 is formed to a layer thickness of 100 nm with a dopant concentration of $1 \times 10^{19}$ cm$^{-5}$ and the dopant As. The second p-doped silicon layer 25 is formed to a layer thickness of 200 nm with a dopant concentration of $1 \times 10^{18}$ cm$^{-3}$ with boron. The third n$^+$-doped layer 26 is formed to a layer thickness of 200 nm with a dopant concentration of $1 \times 10^{19}$ cm$^{-3}$ with the dopant As.

A first trench mask 28 is formed on the main surface 27 by depositing and structuring an SiO$_2$ layer. The SiO$_2$ layer is deposited to a layer thickness of 150 nm using a TEOS process. It is structured, using a photoresist mask, by anisotropic etching using CHF$_3$, O$_2$. After the removal of the photoresist mask, first trenches 29 are etched. The first trenches 29 are produced by anisotropic etching using HBr, He, O$_2$, NF$_3$. The first trenches 29 reach down into the first n$^+$-doped silicon layer 22. The first trenches 29 are in strip form and have a width of 200 nm and a distance between neighboring first trenches 29 of 200 nm. The length of the first trenches 29 is 5 μm and the depth 800 nm.

After the removal of the first trench mask 28 by wet-chemical etching using HF, silicon nitride spacers 210 are formed on sidewalls of the first trenches 29, which sidewalls are essentially perpendicular to the main surface 27. For this purpose, a silicon nitride layer is deposited to a thickness of 70 nm and anisotropically etched selectively with respect to silicon using $CF_4$, $O_2$, $N_2$. The thickness of the nitride layer corresponds to a third of the width of the first trenches 29.

The interspace remaining between the silicon spacers 210 is subsequently filled with a first insulation structure 211. For this purpose, an $SiO_2$ layer is deposited using a TEOS process and anisotropically etched back using $CHF_3$, $O_2$ until the main surface 27 is uncovered (see FIG. 14).

A second trench mask is formed on the main surface 27 by deposition of an $SiO_2$ layer and of a silicon nitride layer. The $SiO_2$ layer is deposited with a thickness of 150 nm using a TEOS process. The thickness of the silicon nitride layer is 70 nm. The nitride layer and the $SiO_2$ layer are structured, using a photoresist mask, by anisotropic etching using $CHF_3$, $O_2$. After the removal of the photoresist mask, second trenches 212 are produced. In this process, firstly silicon is etched anisotropically using HBr, He, $O_2$, $NF_3$. $SiO_2$ is then etched selectively with respect to nitride using $C_2F_6$, $C_3F_8$, the silicon nitride layer of the second trench mask serving as a hard mask. Subsequently, the silicon nitride spacers and, at the same time, the silicon nitride hard mask are removed by wet-chemical processes using $H_3PO_4$.

The second trenches 212 run essentially perpendicular to the first trenches 29 (see FIG. 15, in which the section represented by XV—XV in FIG. 14 is shown). The second trenches 212 have a strip-type cross section with a width of 200 nm, a distance between neighboring second trenches 212 of 200 nm and a length of 5 μm. The depth of the second trenches 212 is 800 nm. The second trenches 212 thus likewise reach down into the first $n^+$-doped silicon layer 22.

The first insulation structure 211 is subsequently removed. This is done by wet-chemical etching of silicon oxide selectively with respect to silicon nitride and silicon using HF.

A first gate oxide 213 is formed to a thickness of 5 nm by thermal oxidation. First word lines 214 are subsequently formed by deposition of an in situ-doped polysilicon layer and anisotropic etching of the doped polysilicon layer. The doped polysilicon layer is deposited in a manner doped with phosphorus. It has a thickness of 70 nm. That corresponds to a third of the width of the first trenches 29 and also of the second trenches 212. Thus, the interspace between the silicon nitride spacers 210 disposed on opposite sidewalls of one of the first trenches 29 is filled, but the second trenches 212, whose sidewalls running essentially perpendicular to the main surface 27 are only covered with the thin first gate oxide 213, are not. The doped polysilicon layer is etched anisotropically using He, HBr, $Cl_2$, $C_2F_6$. The anisotropic etching is continued until the word lines have a height such that they lie in the region of the second $n^+$-doped silicon layer 24. The first word lines 214 have a height such that they cover the first p-doped silicon layer 23 completely (see FIG. 16 and FIG. 17).

Parts of the first word lines 214 annularly surround in each case one of the semiconductor pillars which are defined by in each case two neighboring first trenches 29 and second trenches 212. The free space in the first trenches 29 which has remained between the silicon nitride spacers 210 is in this case completely filled with the first word lines 214. Annular elements of the first word lines 214 border together, therefore, in the first trenches 29. The first word lines 214 are thus formed by annular elements that adjoin one another.

A second insulation structure 215 is subsequently formed by depositing an $SiO_2$ layer and anisotropically etching it back, which second insulation structure, in the second trenches 212, fills the free space that has remained between neighboring first word lines 214. The height of the second insulation structure 215 is greater than that of the first word lines 214. The second insulation structure 215 maximally reaches as far as the interface between the second $n^+$-doped silicon layer 24 and the second p-doped silicon layer 25. The $SiO_2$ layer is deposited using a TEOS process. Anisotropic etching using Ar, $CF_4$, $CHF_3$ is carried out. First gate oxide situated on the main surface 27 and in the upper region of the second trenches 212 is likewise removed in the course of this anisotropic etching.

Silicon structures 216 are subsequently grown on uncovered silicon surfaces by selective epitaxy. The selective epitaxy is effected in the temperature range from 700° C. to 900° C. using a process gas containing silane. The silicon structures 216 cover the uncovered sidewalls in the region of the second trenches 212 above the second insulation structure 215. Furthermore, they cover the surface of the third $n^+$-doped silicon layer 26. The silicon structures 216 have a dimension of 70 nm perpendicular to the silicon surface on which they grow. That corresponds to a third of the width of the second trenches 212. The second trenches 212 are not filled, therefore. The sidewalls of the first trenches 29 are covered by the silicon nitride spacers 210, with the result that no silicon grows on the sidewalls of the first trenches 29 (see FIG. 18 and FIG. 19).

Silicon nitride is attacked selectively with respect to silicon by wet-chemical etching using $H_3PO_4$. The sidewalls of the third $n^+$-doped silicon layer 26 and of the second p-doped silicon layer 25 are at least partially uncovered as a result of such etching. The height of the silicon nitride spacers 210 in the first trenches 29 is thereby reduced (see FIG. 20).

Figure 21:
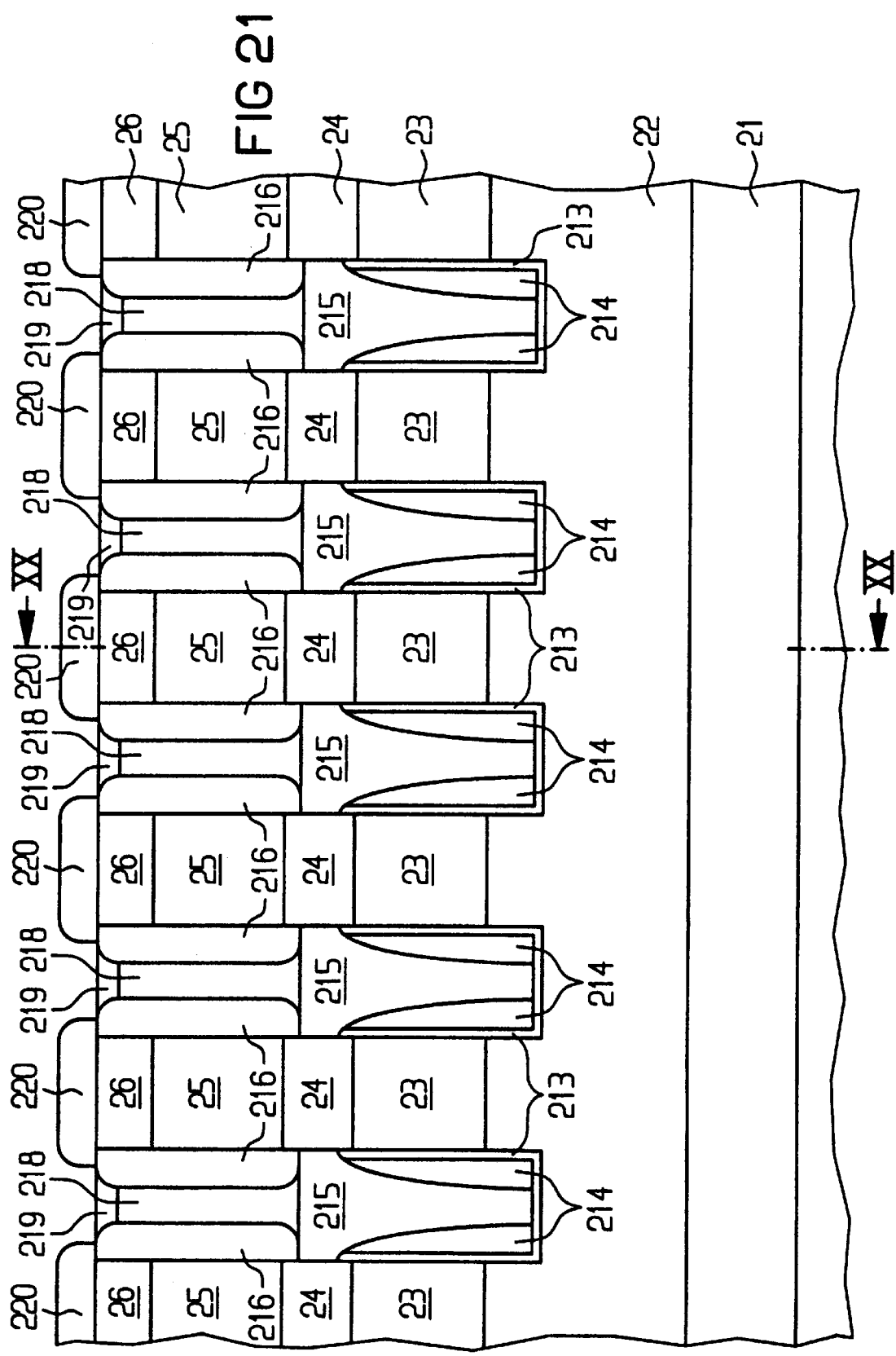
FIG. 21 is a sectional view taken along the line XXI—XXI shown in FIG. 20. The section illustrated in FIG. 20 is taken along the line XX—XX shown in FIG. 21.

A second gate oxide 217 is formed on uncovered silicon areas by thermal oxidation. In particular, the second gate oxide 217 is produced on the uncovered surface of the second p-doped silicon layer 25 in the first trenches 29 (see FIG. 20 and FIG. 21). The second gate oxide 217 is formed to a layer thickness of 5 nm.

Second word lines 218 are formed by the deposition of an in situ-doped polysilicon layer and anisotropically etching back of the doped polysilicon layer. The in situ-doped polysilicon layer is doped with phosphorus and has a dopant concentration of $10^{21}$ $cm^3$. The doped polysilicon layer is deposited to a thickness of 70 nm. That corresponds to a third of the width of the first trenches 29 and of the second trenches 212. The anisotropic etching is continued until the sidewalls of the third $n^+$-doped silicon layer 26 are partially uncovered in the region of the first trenches 29 (see FIG. 20).

Since the width of the second trenches 212 is reduced to approximately a third by the silicon structures 216 in the region of the main surface, the doped polysilicon layer fills the second trenches 212. Correspondingly, the second word lines 218 fill the second trenches in terms of their width. The second word lines 218 include annular elements that each surround one of the silicon pillars. In the second trenches 212, neighboring annular elements abut one another, with the result that the second word lines 218 are formed as a chain of annular elements which adjoin one another.

The first trenches 29 are filled with a third insulation structure 219. For this purpose, an $SiO_2$ layer is deposited using a TEOS process and anisotropically etched using $CHF_3$, $O_2$. The third insulation structure 219 terminates at the same level as the main surface 27.

Storage nodes 220 disposed on the main surface 27 are formed by implantation with arsenic with an energy of 20 keV and a dose of $10^{14}$ cm$^{-2}$. The storage nodes 220 are formed from the parts of the silicon structure 216 that are situated on the main surface 27. The storage nodes 219 are electrically connected to the third n$^+$-doped silicon layer 26.

A capacitor dielectric 221 is subsequently deposited over the whole area. The capacitor dielectric 221 is formed from SiO$_2$, a triple layer made of SiO$_2$, Si$_3$N$_4$ and SiO$_2$, or a high-epsilon dielectric, for example BST (barium strontium titanate) or SBT (strontium bismuth tantalate).

A capacitor plate 222 is applied to the capacitor dielectric 221. The capacitor plate 221 is formed by in situ-doped deposition of polysilicon to a layer thickness of 200 nm and planarization of the doped polysilicon layer. The doped polysilicon layer is doped with phosphorus with a dopant concentration of $10^{21}$ cm$^{-3}$ (see FIG. 22).

Figure 22:
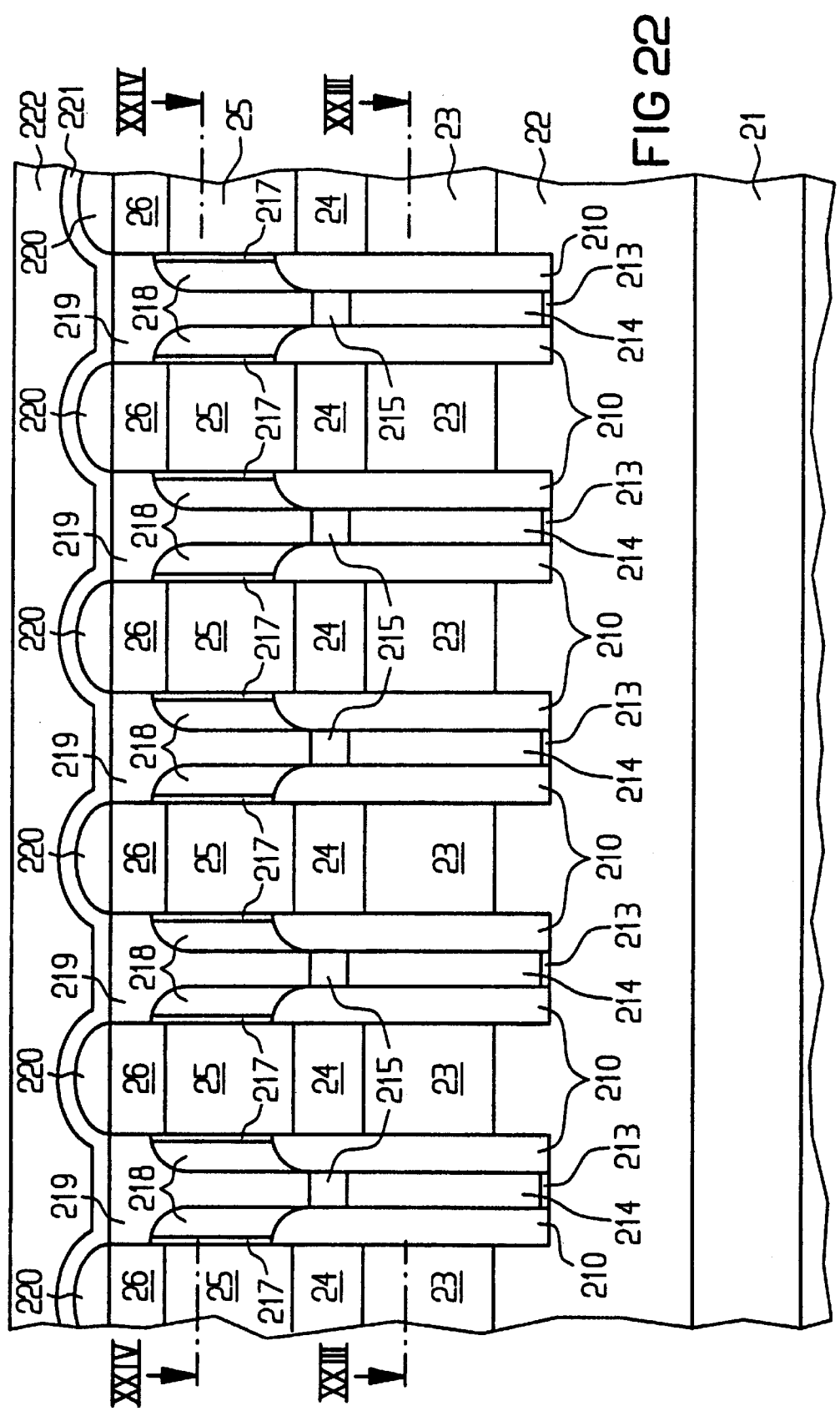
FIG. 22 is a sectional view corresponding to the section illustrated in FIG. 20 after the formation of a capacitor dielectric and of a capacitor plate.
Figure 23:
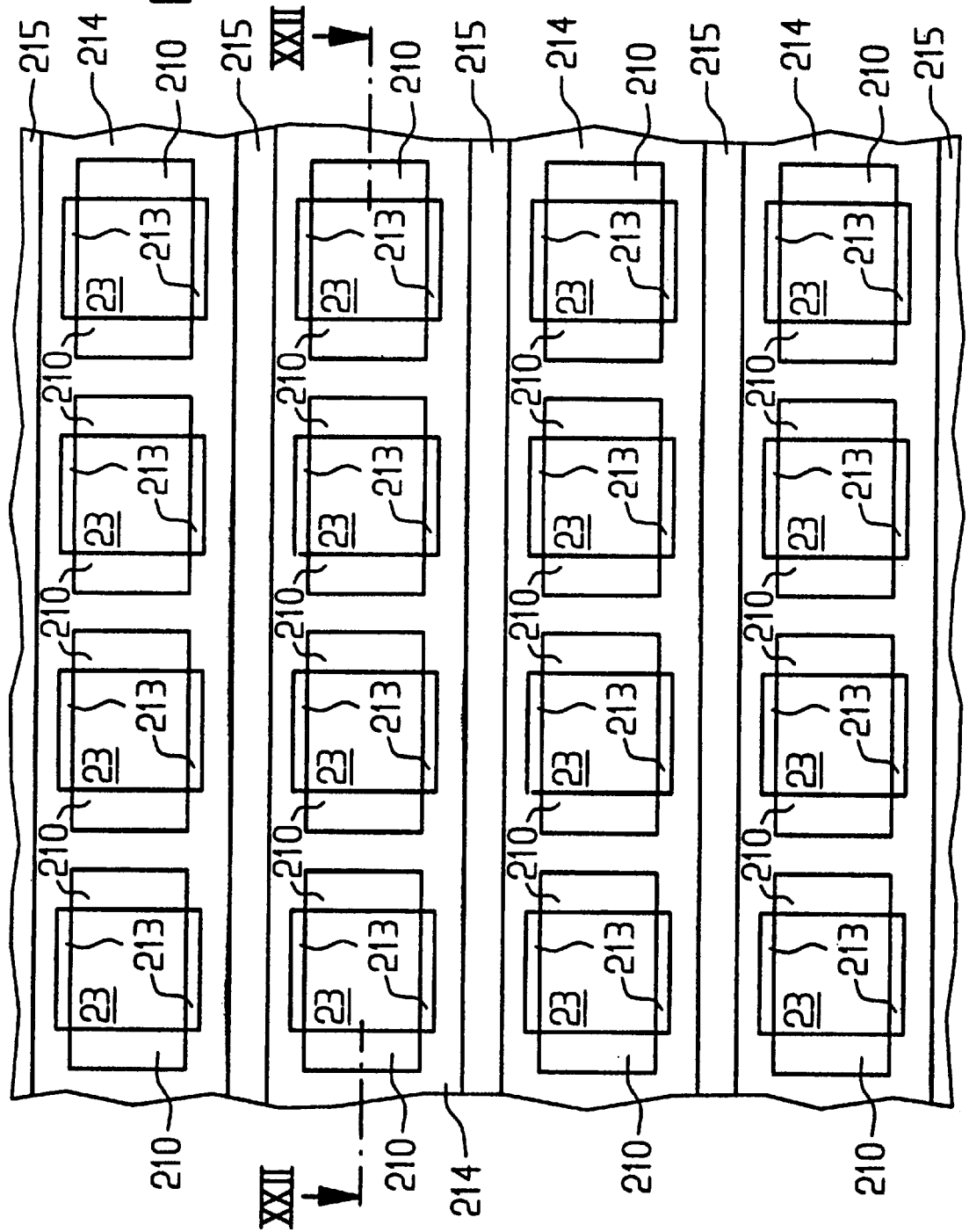
FIG. 23 is a sectional view taken along the line XXIII—XXIII shown in FIG. 22.
Figure 24:
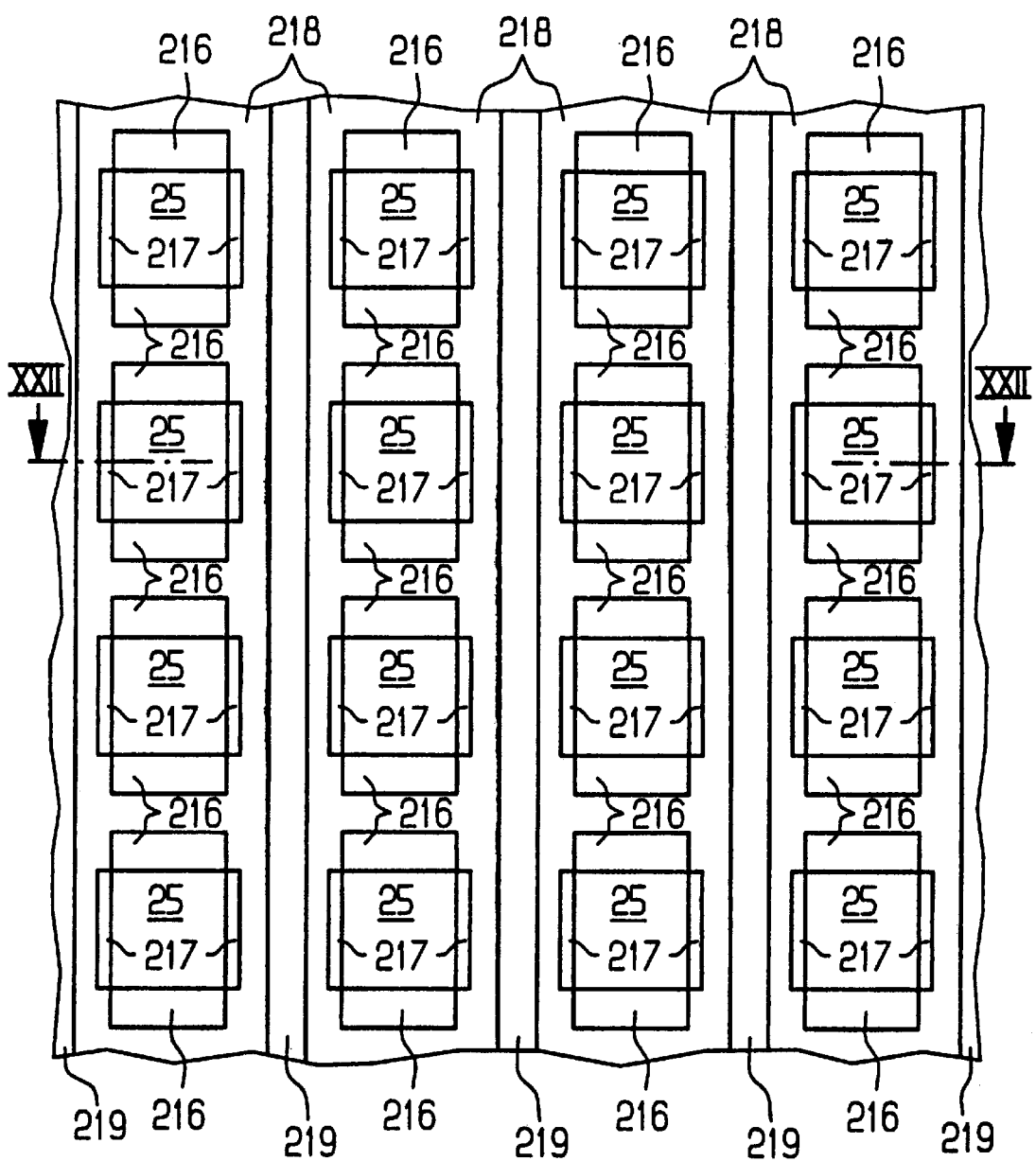
FIG. 24 is a sectional view taken along the line XIV—XIV shown in FIG. 22.

FIG. 23 shows the section designated by XXIII—XXIII in FIG. 22. FIG. 24 shows the section designated by XXIV—XXIV in FIG. 22. The first word lines 214 and the second word lines 218 are in each case constructed as a chain of annular elements and in each case run parallel to one another. The first word lines 214 and the second word lines 218 run transversely with respect to one another.

In this embodiment of the memory cell configuration, each semiconductor pillar includes a memory cell. The semiconductor pillar in each case is defined by two neighboring first trenches 29 and second trenches 212. The memory cell has a first selection transistor, which is formed from the first n-doped silicon layer 22 and the second n$^+$-silicon layer 24 as the source/drain regions, the first p-doped silicon layer 23 as the channel region, the first gate oxide 213 and first word line 214 as the gate electrode. A second selection transistor of the memory cell is formed from the second n$^+$-doped silicon layer 24 and the third n$^+$-doped silicon layer 26 as the source/drain region, the second p-doped silicon layer 25 as the channel region, the second gate oxide 217 and the second word line 218 as the gate electrode. The first selection transistor and the second selection transistor are connected in series via the second n$^+$-doped silicon layer 24, which acts as a common source/drain region. The first n$^+$-doped silicon layer 22 acts as a common bit line.

In a variant of this exemplary embodiment, the second n+-doped silicon layer 24 is replaced by a p-doped silicon layer. In this case, each memory cell includes only one selection transistor, which, however, is driven via two gate electrodes which are disposed one above the other and whose leakage fields are large enough that they overlap. In the on state, the overlapping leakage fields lead to the formation of a conductive channel from the first n$^+$-doped silicon layer 22 to the third n$^+$-doped silicon layer 26 through all the p-doped silicon layers. The selection transistor acts like two series-connected selection transistors, since a conductive channel is formed only when both gate electrodes are driven.

In order to write in an item of information in a memory cell configuration with first word lines WLXi, i=1 to n, and second word lines WLYi, i=1 to n, and a common bit line plate BLP, a data word is read into a first shift register SR1 via a data line DL (FIG. 25). In parallel with this, the data word is inverted by an inverter I and read into a second shift register SR2. The outputs of the first shift register SR1 are connected via a switch S1 to the first word lines WLXi, i=1 to n. The outputs of the second shift register are connected via a switch S2 to the first word lines WLXi, i=1 to n.

In order to write in an item of information having the logic value one, the switch S1 is driven in such a way that the outputs of the first shift register SR1 are connected to the first word lines WLXi, i=1 to n. A voltage value corresponding to a logic one is applied to the bit line plate BLP. The individual memory cells in which a logic one is stored are driven via the first word lines WLXi, i=1 to n, and the second word line WLYi, i=1. In this way, without any charge reversal of the bit line plate BLP, a one is written to all the memory cells along the second word line WLYi, i=1, in which a one is supposed to be stored.

Subsequently, the connection between the first word lines WLXi, i=1 to n, and the first shift register SR1 is disconnected by corresponding driving of the switch S1 and a voltage level corresponding to a logic zero is applied to the bit line plate BLP. The switch S2 is then driven in such a way that the second shift register is connected to the first word lines WLXi, i=1 to n. The individual memory cells in which a logic zero is supposed to be stored are then driven via the first word lines WLXi, i=1 to n, and the second word lines WLYi, i=1. The next data word is correspondingly read in, the second word line WLYi, i=2, now being switched on. For reading in the following data words, the running index i of the second word line WLYi is incremented further (see FIG. 25).

In order to read out a memory cell configuration with first word lines WLXi, i=1 to n, and second word lines WLYi, i=1 to n, and bit lines BLi in strip form, i=1 to n, the individual memory cells disposed along a bit line BLi in strip form are successively driven via the associated first word line WLXi and the associated second word lines WLYi, i=1 to n (see FIG. 26). The data are read out in parallel for all the bit lines BLi, i=1 to n. This parallel read-out takes place within a cell block ZB. In addition to this, it is possible to define a plurality of cell blocks which are furthermore read out in parallel. The data access time is thereby shortened.

In order to refresh data in a DRAM cell configuration, the stored information items, as depicted with reference to FIG. 26, are read out into a shift register and subsequently read back in, as depicted with reference to FIG. 25. The advantage of this operating method resides in the fact that the stored information which is read out is used only for the purpose of driving a word line and not for the purpose of raising the associated level in the memory cell.

We claim:

1. A memory cell configuration, comprising:

a semiconductor substrate having a main surface;

a multiplicity of memory cells disposed in said semiconductor substrate, said memory cells each having a storage element and at least one selection transistor disposed vertically to said main surface of said semiconductor substrate and connected to said storage element; and a first word line and a second word line crossing one another and driving said memory cells, said at least one selection transistor of each of said memory cells including a first selection transistor and a second selection transistor connected in series, said first word line driving said first selection transistor and said second word line driving said second selection transistor.

2. The memory cell configuration according to claim 1, including common bit lines, said memory cells are combined to form cell blocks and said memory cells of a respective one of said cell blocks are connected to a respective one of said common bit lines.

3. The memory cell configuration according to claim 1, wherein said first selection transistor is a vertical transistor with respect to said main surface of said semiconductor substrate, and said first selection transistor and said second selection transistor are disposed one above the other.

4. The memory cell configuration according to claim 3, wherein said second selection transistor is a vertical transistor with respect to said main surface of said semiconductor substrate.

5. The memory cell configuration according to claim 4, wherein said semiconductor substrate has semiconductor pillars each with sidewalls and adjoining said main surface, said sidewalls of said semiconductor pillars crossing said main surface, one of said first selection transistor and said second selection transistor is a MOS transistor and is disposed on at least one of said sidewalls of said semiconductor pillars for each of said memory cells.

6. The memory cell configuration according to claim 4, wherein:

said semiconductor substrate has semiconductor pillars disposed in a grid pattern and adjoining said main surface, said semiconductor pillars having sidewalls crossing said main surface;

said first selection transistor and said second selection transistor of each of said memory cells are disposed along at least on one of said sidewalls of one of said semiconductor pillars;

said first word line having annular elements surrounding neighboring semiconductor pillars and connected to one another; and said second word line, running transversely with respect to said first word line, has annular elements surrounding neighboring semiconductor pillars and connected to one another.

7. The memory cell configuration according to claim 1, wherein said at least one selection transistor is only one selection transistor and is driven by said first word line and said second word line.

8. The memory cell configuration according to claim 7, wherein:

said semiconductor substrate has semiconductor pillars with sidewalls crossing said main surface and disposed in a grid pattern;

said at least one selection transistor of each of said memory cells is disposed along at least one of said sidewalls of one of said semiconductor pillars and has a source region and a drain region, said at least one selection transistor also having a first gate electrode and a second gate electrode disposed one above another and between said source region and said drain region;

said first word line having annular elements surrounding neighboring semiconductor pillars and are connected to one another;

said second word line, running transversely with respect to said first word line, has annular elements surrounding neighboring semiconductor pillars and are connected to one another; and said first word line connected to said first gate electrode, and said second word line connected to said second gate electrode.

9. The memory cell configuration according to claim 1, wherein said storage element is a storage capacitance.

10. The memory cell configuration according to claim 9, including bit lines buried in said semiconductor substrate, and said storage capacitance is disposed at least one of on and above said main surface of said semiconductor substrate.

* * * * *